(12) United States Patent
Kim

(10) Patent No.: US 12,514,034 B2
(45) Date of Patent: Dec. 30, 2025

(54) LIGHT EMITTING DIODE AND METHOD OF FABRICATING THE SAME

(71) Applicant: SEOUL VIOSYS CO., LTD., Gyeonggi-do (KR)

(72) Inventor: Chae Hon Kim, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 662 days.

(21) Appl. No.: 17/939,689

(22) Filed: Sep. 7, 2022

(65) Prior Publication Data

US 2023/0070171 A1 Mar. 9, 2023

Related U.S. Application Data

(60) Provisional application No. 63/242,472, filed on Sep. 9, 2021.

(51) Int. Cl.
*H10H 20/825* (2025.01)
*H10H 20/816* (2025.01)
*H10H 20/831* (2025.01)
*H10H 20/857* (2025.01)

(52) U.S. Cl.
CPC .... *H10H 20/8312* (2025.01); *H10H 20/8162* (2025.01); *H10H 20/825* (2025.01); *H10H 20/857* (2025.01)

(58) Field of Classification Search
CPC ............. H10H 20/825; H10H 20/8162; H10H 20/8312
See application file for complete search history.

(56) References Cited

U.S. PATENT DOCUMENTS

| 7,087,941 B2 | 8/2006 | Gardner et al. |
| 9,064,845 B2 | 6/2015 | Gaska et al. |
| 9,269,788 B2 | 2/2016 | Gaska et al. |
| 9,793,367 B2 | 10/2017 | Gaska et al. |
| 9,960,321 B2 | 5/2018 | Shur et al. |
| 10,573,781 B1 | 2/2020 | Munkholm et al. |
| 10,707,379 B2 | 7/2020 | Dobrinsky et al. |

(Continued)

FOREIGN PATENT DOCUMENTS

| EP | 3246955 A1 | 11/2017 |
| JP | 2018049895 A | 3/2018 |

OTHER PUBLICATIONS

International Search Report for International Application No. PCT/KR2022/013520, mailed Dec. 22, 2022, English translation, 4 pages.

*Primary Examiner* — Douglas M Menz
(74) *Attorney, Agent, or Firm* — LaBatt, LLC

(57) ABSTRACT

A light emitting diode and a method of fabricating the same are provided. The light emitting diode according to exemplary embodiments includes a lower n-type semiconductor layer, an active layer, a p-type semiconductor layer, a high-concentration n-type semiconductor layer, and an upper n-type semiconductor layer. The high concentration n-type semiconductor layer can have a higher n-type doping concentration than that of the lower or upper n-type semiconductor layer. Oxygen concentrations on a lower surface and an upper surface of the high-concentration n-type semiconductor layer may be substantially same. An electron blocking layer may be interposed between the active layer and the p-type semiconductor layer.

20 Claims, 12 Drawing Sheets

(56) References Cited

U.S. PATENT DOCUMENTS

| | | |
|---|---|---|
| 10,734,554 B2 | 8/2020 | Heo et al. |
| 2008/0277682 A1* | 11/2008 | Mishra ................ H10H 20/811 257/E33.001 |
| 2018/0047868 A1* | 2/2018 | David .................. H10H 20/813 |
| 2018/0277714 A1* | 9/2018 | Furusawa ........ H10H 20/01335 |
| 2019/0123239 A1 | 4/2019 | Shatalov et al. |

* cited by examiner

LIGHT EMITTING DIODE AND METHOD OF FABRICATING THE SAME

CROSS-REFERENCE TO RELATED APPLICATIONS AND PRIORITY

This application claims priority to and the benefit of U.S. Provisional Application No. 63/242,472, filed on Sep. 9, 2021, the disclosure of which is hereby incorporated by reference for all purposes as if fully set forth herein.

BACKGROUND

1. Field of Disclosure

The present disclosure relates to an inorganic semiconductor light emitting diode, and more particularly, to a light emitting diode capable of lowering a forward voltage by improving ohmic characteristics, and a method of fabricating the same.

2. Description of the Related Art

In general, nitrides of group III elements, such as gallium nitride (GaN) and aluminum nitride (AlN), have recently been in the spotlight as a material for light sources in the visible and ultraviolet regions, with favorable thermal stability and a direct transition type energy band structure. In particular, blue and green light emitting diodes using Indium Gallium Nitride (InGaN) have been used in various applications such as large-scale full color flat panel displays, traffic lights, indoor lighting, high-density light sources, high-resolution output systems, optical communication, and others. Ultraviolet light emitting diodes using GaN, AlGaN, or AlGaInN are also used in various applications, including sterilization devices, water or air purification devices, high-density optical recording devices, and excitation sources in bio-aerosol fluorescence detection systems.

In general, the light emitting diode includes an n-type semiconductor layer, a p-type semiconductor layer, and an active layer interposed there between. An ohmic contact layer is formed on the n-type semiconductor layer and the p-type semiconductor layer so as to inject electrons and holes. In general, an ohmic contact for the n-type semiconductor layer exhibits better ohmic resistance characteristics than an ohmic contact for the p-type semiconductor layer, and thus, efforts have been made to lower the ohmic resistance of the ohmic contact layer for the p-type semiconductor layer.

Furthermore, in a case of the ultraviolet light emitting diode, it is difficult to form an ohmic contact to a p-type AlGaN layer, and thus a p-type GaN layer absorbing ultraviolet light is used for the ohmic contact. However, since the p-type GaN layer absorbs ultraviolet light, a luminous efficiency of the ultraviolet light emitting diode is significantly lower than that of the blue light emitting diode.

SUMMARY

Exemplary embodiments provide a light emitting diode having improved ohmic characteristics and a lowered forward voltage and a method of fabricating the same.

Exemplary embodiments provide a light emitting diode with an improved luminous efficiency and a method of fabricating the same.

A method of fabricating a light emitting diode according to an exemplary embodiment of the present disclosure includes: disposing a substrate in a chamber; growing a lower n-type semiconductor layer on the substrate in the chamber; growing an active layer on the n-type semiconductor layer in the chamber; growing a p-type semiconductor layer on the active layer in the chamber; growing a high-concentration n-type semiconductor layer on the p-type semiconductor layer in the chamber; and growing an upper n-type semiconductor layer on the high-concentration n-type semiconductor layer in the chamber. The method of fabricating the light emitting diode further includes activating a p-type dopant by introducing an $N_2$ gas into the chamber at a first temperature during a first time before growing the high-concentration n-type semiconductor layer. The high-concentration n-type semiconductor layer has a higher n-type dopant concentration than that of the lower or upper n-type semiconductor layer, and the lower n-type semiconductor layer, the active layer, the p-type semiconductor layer, the high-concentration n-type semiconductor layer, and the upper n-type semiconductor layer are grown in an in-situ process in the chamber.

In an exemplary embodiment, supplies of an $H_2$ gas and an $NH_3$ gas into the chamber may be blocked while the p-type dopant is activated.

In an exemplary embodiment, while the high-concentration n-type semiconductor layer is grown, the $N_2$ and the $NH_3$ gas may be supplied into the chamber, and the supply of $H_2$ gas may be blocked.

In an exemplary embodiment, the high-concentration n-type semiconductor layer may be grown at the first temperature.

The method of fabricating a light emitting diode may further include growing a high-concentration p-type semiconductor layer doped at a higher concentration than that of the p-type semiconductor layer on the p-type semiconductor layer, in which the high-concentration p-type semiconductor layer may have a higher p-type dopant concentration than that of the p-type semiconductor layer, and activating the p-type dopant may be carried out after growing the high-concentration p-type semiconductor layer.

The first temperature may be lower than a temperature for growing the high-concentration p-type semiconductor layer and a temperature for growing the upper n-type semiconductor layer, but may be higher than 700° C.

When the high-concentration p-type semiconductor layer is GaN or InGaN, the first temperature may be lower than 800° C., and when the high-concentration p-type semiconductor layer is AlGaN, the first temperature may be higher than 800° C.

The high-concentration n-type semiconductor layer may be a gallium nitride-based semiconductor layer having a same composition as that of the high-concentration p-type semiconductor layer.

The high-concentration n-type semiconductor layer may be a gallium nitride-based semiconductor layer having a same composition as that of the p-type semiconductor layer.

The method of fabricating the light emitting diode may further include growing an electron blocking layer on the active layer before growing the p-type semiconductor layer.

A light emitting diode according to an exemplary embodiment of the present disclosure includes: a lower n-type semiconductor layer; an active layer disposed on the lower n-type semiconductor layer; a p-type semiconductor layer disposed on the active layer; a high-concentration n-type semiconductor layer disposed on the p-type semiconductor layer; and an upper n-type semiconductor layer disposed on the high-concentration n-type semiconductor layer, in which the high-concentration n-type semiconductor layer has an n-type doping concentration higher than that of the lower or upper n-type semiconductor layer, and oxygen concentrations on a lower surface and an upper surface of the high-concentration n-type semiconductor layer are substantially same.

Furthermore, the upper n-type semiconductor layer may have a roughened surface on its upper surface.

The light emitting diode may further include a high-concentration p-type semiconductor layer interposed between the p-type semiconductor layer and the high-concentration n-type semiconductor layer, in which the high-concentration p-type semiconductor layer may have a higher p-type doping concentration than that of the p-type semiconductor layer.

The light emitting diode may include: a first contact layer in contact with the lower n-type semiconductor layer; and a second contact layer in contact with the upper n-type semiconductor layer, in which the first and second contact layers may include a same material layer in contact with the lower and upper n-type semiconductor layers.

The light emitting diode may further include an electron blocking layer interposed between the active layer and the p-type semiconductor layer.

The light emitting diode may further include: a mesa disposed on the lower n-type semiconductor layer, including the active layer, the p-type semiconductor layer, the high-concentration n-type semiconductor layer, and the upper n-type semiconductor layer, and having a plurality of via holes exposing the lower n-type semiconductor layer; lower n-ohmic contact layers in contact with the n-type semiconductor layer in the via holes; an upper n-ohmic contact layer in contact with the upper n-type semiconductor layer; a first pad metal layer electrically connected to the lower n-ohmic contact layers; a second pad metal layer electrically connected to the upper n-ohmic contact layer; a first bump electrically connected to the first pad metal layer; and a second bump electrically connected to the second pad metal layer, in which the second pad metal layer may be formed to surround the first pad metal layer.

In an exemplary embodiment, the first pad metal layer may cover the via holes.

In an exemplary embodiment, the second pad metal layer may be disposed between the via holes and an edge of the mesa.

The light emitting diode may further include a lower insulation layer covering the upper n-ohmic contact layer and the lower n-ohmic contact layer, in which the lower insulation layer has openings exposing the upper n-ohmic contact layer and the lower n-ohmic contact layers, and the first pad metal layer and the second pad metal layer may be electrically connected to the lower n-ohmic contact layers and the upper n-ohmic contact layer through the openings of the lower insulation layer, respectively.

The light emitting diode may further include an upper insulation layer covering the first and second pad metal layers, in which the upper insulation layer has openings exposing the first pad metal layer and the second pad metal layer, the first bump and the second bump may be disposed on the upper insulation layer, and the first bump and the second bump may be electrically connected to the first pad metal layer and the second pad metal layer through the openings of the upper insulation layer.

DETAILED DESCRIPTION OF EMBODIMENTS

Figure 1:
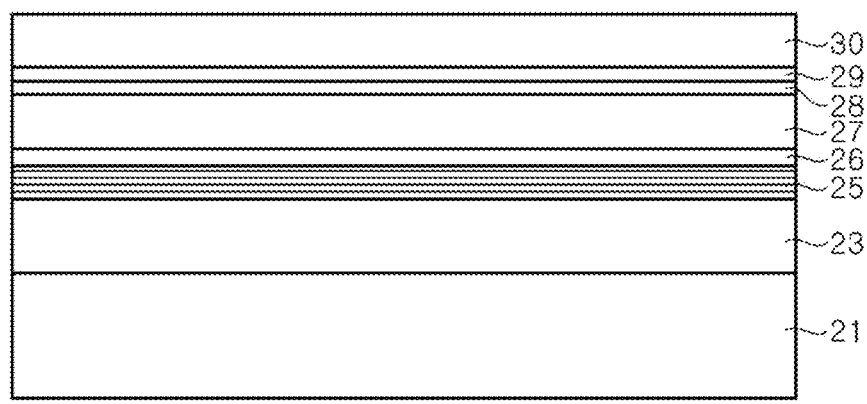
FIG. 1 is a schematic cross-sectional view illustrating a heterostructure for a light emitting diode according to an exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the exemplary embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Additionally, as used herein, "vertical" is used to reference the growth direction of the corresponding structure, while "lateral" is used to reference a direction that is perpendicular to the growth direction. Additionally, spatially relative terms, such as "on," "below," "above," etc., are used in reference to the orientation shown in the drawings. It is understood that embodiments of the invention are not limited to any particular orientation of a device described herein. Throughout the specification, like reference numerals denote like elements having the same or similar functions.

Nitride-based semiconductor layers described below may be grown using a variety of generally known methods, and may be grown using technology, for example, metal organic chemical vapor deposition (MOCVD), molecular beam epitaxy (MBE), or hydration vapor phase epitaxy (HYPE), or the like. In particular, in exemplary embodiments described below, the semiconductor layers are described as being grown in a growth chamber using the MOCVD. In a process of growing the nitride-based semiconductor layers, sources introduced into the growth chamber may use a generally known source, for example, TMGa, TEGa, or the like may be used as a Ga source, TMAl, TEAl, or the like may be used as an Al source, TMIn, TEIn, or the like may be used as an In source, and $NH_3$ may be used as an N source. However, the inventive concepts are not limited thereto.

FIG. 1 is a schematic cross-sectional view illustrating a heterostructure for a light emitting diode according to an exemplary embodiment of the present disclosure.

Referring to FIG. 1, the light emitting diode heterostructure according to the illustrated exemplary embodiment may include a substrate 21, a lower n-type semiconductor layer 23, an active layer 25, an electron blocking layer 26, a p-type semiconductor layer 27, and a high-concentration p-type semiconductor layer 28, a high-concentration n-type semiconductor layer 29, and an upper n-type semiconductor layer 30.

The substrate 21 is not particularly limited as long as it is a substrate capable of growing a nitride-based semiconductor, and may include, for example, a heterogeneous substrate such as a sapphire substrate, a silicon substrate, a silicon carbide substrate, or a spinel substrate, and may also include a homogeneous substrate such as a gallium substrate, an aluminum nitride substrate, or the like. In embodiments, a growth surface of the substrate 21 can be patterned to promote lateral growth of the n-type semiconductor layer 23, thereby reducing a density of dislocations in the n-type semiconductor layer 23.

The lower n-type semiconductor layer 23 is disposed on the substrate 21. The lower n-type semiconductor layer 23 may be formed of a single layer or may be formed of multiple layers. For example, the lower n-type semiconductor layer 23 may include a nucleation layer, a low-temperature buffer layer, and an n-type contact layer. The lower n-type semiconductor layer 23 may include a GaN, AlGaN, and/or AlInGaN layer. The lower n-type semiconductor layer 23 may be variously selected depending on a desired wavelength of light, and this matter is well known in the art.

For example, in a case of a blue or near-ultraviolet light emitting diode, the lower n-type semiconductor layer 23 may include a GaN or InGaN buffer layer and an n-type GaN layer. Furthermore, the lower n-type semiconductor layer 23 may include various functional layers such as a superlattice layer, an InGaN layer, an AlGaN layer, or the like.

As another example, in a case of a deep ultraviolet light emitting diode of about 300 nm or less, the lower n-type semiconductor layer 23 may include an AlN buffer layer (about 3.79 μm) and an n-type AlGaN layer. Furthermore, the n-type AlGaN layer may be composed of a plurality of layers having different Al molar ratios from one another. When a gallium nitride-based semiconductor layer is grown on a sapphire substrate 21, the lower n-type semiconductor layer 23 may generally include a plurality of layers so as to improve a crystal quality.

The active layer 25 may include a single quantum well structure or a multi-quantum well structure including a well layer and a barrier layer. Compositions of the well layer and the barrier layer may be selected so as to generate a desired light. For example, in a case of a blue light emitting diode, the well layer may include an InGaN layer, and the barrier layer may include a nitride semiconductor layer having a wider band gap than that of the well layer, for example, an InGaN or GaN layer. In a case of an ultraviolet light emitting diode, the well layer may include an AlGaN or AlInGaN layer, and the barrier layer may include an AlGaN or AlInGaN layer having a wider band gap than that of the well layer.

The electron blocking layer 26 prevents electrons from overflowing from the active layer 25 to the p-type semiconductor layer 27 to improve a recombination rate of electrons and holes. The electron blocking layer 26 may be formed of a nitride semiconductor layer having a wider band gap than that of the barrier layer in the active layer 25, for example, p-type AlGaN. The electron blocking layer 26 may be omitted.

The p-type semiconductor layer 27 generates holes that are injected into the active layer 25. The p-type semiconductor layer 27 may include a GaN layer, an AlGaN layer, or an AlInGaN layer. The p-type semiconductor layer 27 may be formed of a nitride semiconductor layer that transmits light generated in the active layer 25. That is, the p-type semiconductor layer 27 may be formed of a nitride semiconductor layer having a wider band gap than that of the well layer. In particular, even in a case of a deep ultraviolet light emitting diode in which the active layer 25 includes an AlGaN well layer, the p-type semiconductor layer 27 may be formed of a nitride semiconductor layer having a wider band gap than that of the AlGaN well layer. However, the inventive concepts are not necessarily limited thereto. For example, the active layer 25 may include an AlGaN well layer, and the p-type semiconductor layer 27 may include a p-type GaN layer.

The high-concentration p-type semiconductor layer 28 is a layer doped with a p-type dopant, for example, Mg, at a higher concentration than that of the p-type semiconductor layer 27. For example, the p-type semiconductor layer 27 may have a p-type dopant concentration within a range of $1\times10^{19}/cm^3$ to $1\times10^{20}/cm^3$ on average, but a p-type dopant concentration of the high-concentration p-type semiconductor layer 28 may exceed $1\times10^{20}/cm^3$. The high-concentration p-type semiconductor layer 28 may be a delta-doped layer.

In an exemplary embodiment, the high-concentration p-type semiconductor layer 28 may be formed of a gallium nitride-based semiconductor layer having a same composition as that of the p-type semiconductor layer 27. In particular, the high-concentration p-type semiconductor layer 28 may be formed of a nitride-based semiconductor layer that transmits light generated in the active layer 25. However, the inventive concepts are not necessarily limited thereto. In addition, the high-concentration p-type semiconductor layer 28 may be omitted.

The high-concentration n-type semiconductor layer 29 is a layer doped with an n-type dopant, for example, Si at a higher concentration than that of the lower n-type semiconductor layer 23. For example, the lower n-type semiconductor layer 23 may have an n-type dopant concentration of $1\times10^{18}/cm^3$ to $5\times10^{19}/cm^3$ on average, but the high-concentration n-type semiconductor layer 29 may have an n-type dopant concentration of $1\times10^{20}/cm^3$ or more. The high-concentration n-type semiconductor layer 29 may be a delta-doped layer.

The upper n-type semiconductor layer 30 may be a gallium nitride-based semiconductor layer doped with an n-type dopant, for example, Si. Similar to the lower n-type semiconductor layer 23, the upper n-type semiconductor layer 30 may have a dopant doping concentration within a range of $1\times10^{19}/cm^3$ to $5\times10^{19}/cm^3$. The upper n-type semiconductor layer 30 may also include a capping layer having a relatively high dopant doping concentration on an upper surface thereof.

The semiconductor layers 23, 25, 26, 27, 28, 29, and 30 may be grown on the substrate 21 through an in-situ process without vacuum breaking using an organometallic chemical vapor deposition technique. This will be described in detail with reference to FIG. 2.

Figure 2:
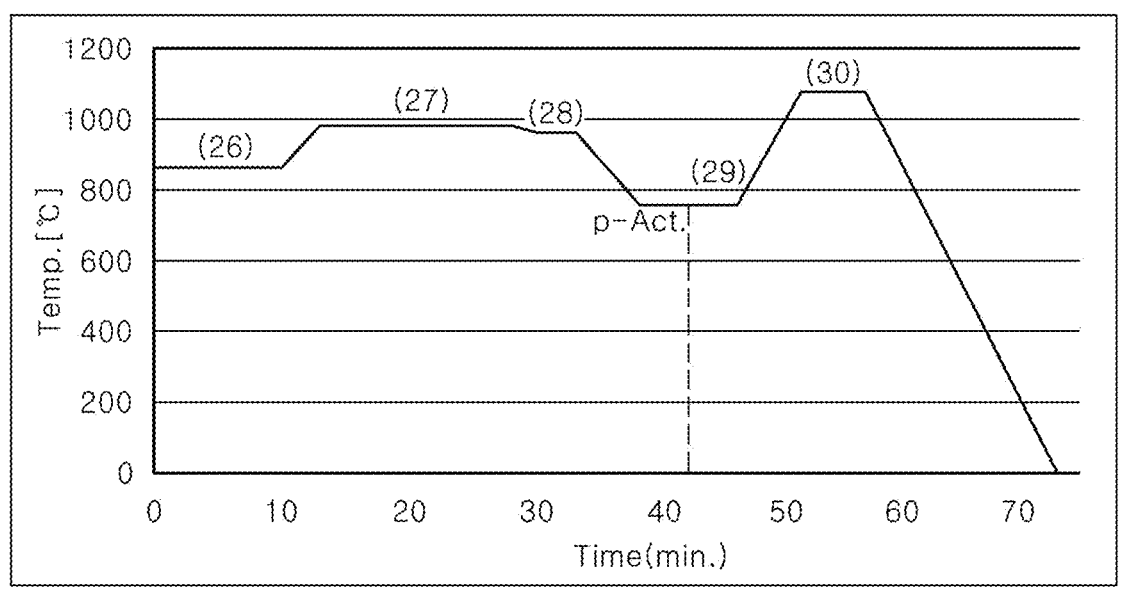
FIG. 2 is a schematic graph illustrating a method of fabricating a heterostructure for a light emitting diode according to an exemplary embodiment of the present disclosure.

FIG. 2 is a schematic graph illustrating a method of fabricating a heterostructure for a light emitting diode according to an exemplary embodiment of the present disclosure.

FIG. 2 shows growth temperatures of each layer from an electron blocking layer 26 over time, omitting processes before the electron blocking layer 26.

A substrate 21 is disposed in a chamber. The chamber can be pumped in a high vacuum, and various source gases and carrier gases for growing a nitride-based semiconductor layer on the substrate 21 may be supplied into the chamber. In addition, the substrate 21 may be heated to reach a set temperature in the chamber.

As described above, the substrate 21 is not particularly limited as long as it is a substrate capable of growing a gallium nitride-based semiconductor layer. A lower n-type semiconductor layer 23 and an active layer 25 may be grown on the substrate 21 disposed in the chamber, and the electron blocking layer 26 may be grown on the active layer 25.

For example, the electron blocking layer 26 may be formed of an AlGaN layer, and an $N_2$ gas may be supplied as a carrier gas together with a source gas, and a supply of $H_2$ gas may be blocked so as not to damage a crystal quality of the active layer 25.

After the electron blocking layer 26 is grown, a temperature of the chamber may be elevated, and a p-type semiconductor layer 27 may be grown at a temperature higher than a growth temperature of the electron blocking layer 26. The p-type semiconductor layer 27 may be grown as a GaN layer, for example. While the p-type semiconductor layer 27 is grown, the $N_2$ gas and the $H_2$ gas may be supplied together with the source gas.

A high-concentration p-type semiconductor layer 28 may be grown on the p-type semiconductor layer 27. The high-concentration p-type semiconductor layer 28 may be formed so as to have a higher p-type dopant concentration than that of the p-type semiconductor layer 27. The high-concentration p-type semiconductor layer 28 may be formed of a same gallium nitride-based composition as that of the p-type semiconductor layer 27, for example, a GaN layer. However, the high-concentration p-type semiconductor layer 28 may be grown at a temperature lower than a growth temperature of the p-type semiconductor layer 27. The high-concentration p-type semiconductor layer 28 may be omitted.

After the high-concentration p-type semiconductor layer 28 is grown, the temperature of the chamber is lowered to a temperature (a first temperature) lower than growth temperatures of the p-type semiconductor layer 27 and the high-concentration p-type semiconductor layer 28. The first temperature may be a temperature for activating a p-type dopant, for example, Mg, of the p-type semiconductor layer 27 or the high-concentration p-type semiconductor layer 28. For example, when the p-type semiconductor layer 27 is a GaN layer, the first temperature may be higher than 700° C., and further higher than 750° C. and lower than 800° C. After the temperature of the chamber is lowered to the first temperature, the substrate is maintained in the chamber during a first time in a state in which the $N_2$ gas is supplied and the supplies of the $H_2$ gas and the $NH_3$ gas are blocked. The first time may vary depending on the first temperature, but may be maintained for about 2 to 10 minutes.

After the p-type semiconductor layer 27 or the high-concentration p-type semiconductor layer 28 is grown, by maintaining the substrate 21 at the first temperature during the first time, the p-type dopant in the p-type semiconductor layer 27 and/or the high-concentration p-type semiconductor layer 28 may be activated, and hydrogen may be released from these layers 27 and 28. Hydrogen prevents the activation of the p-type dopant such as Mg, and Mg can be activated by releasing hydrogen.

Furthermore, by maintaining the temperature of the chamber at the first temperature during the first time, the Mg source gas attached to a chamber wall or the like may be emitted out of the chamber, thereby reducing a memory effect that Mg is doped during deposition of a subsequent layer.

Subsequently, a high-concentration n-type semiconductor layer 29 is grown on the high-concentration p-type semiconductor layer 28 in which the p-type dopant is activated. The high-concentration n-type semiconductor layer 29 may be grown at the first temperature, but the inventive concepts are not limited thereto. Further, the supply of hydrogen gas into the chamber may be blocked so as to prevent hydrogen from being introduced into the high-concentration p-type semiconductor layer 28 while the high-concentration n-type semiconductor layer 29 is grown. The high-concentration n-type semiconductor layer 29 may be formed of, for example, a GaN layer, and may be formed so as to have a higher doping concentration than that of the lower n-type semiconductor layer 23.

An upper n-type semiconductor layer 30 is grown on the high-concentration n-type semiconductor layer 29. After the high-concentration n-type semiconductor layer 29 is grown, the temperature of the chamber may be elevated. The temperature of the chamber may be, for example, elevated to a temperature higher than a growth temperature of the p-type semiconductor layer 27, and source gases and carrier gases are supplied into the chamber at the elevated temperature so that the upper n-type semiconductor layer 30 may be grown. At this time, the $H_2$ gas may be supplied together with the $N_2$ gas and the $NH_3$ gas.

After the growth of the upper n-type semiconductor layer 30 is completed, the temperature of the chamber is lowered, e.g., to room temperature, and the substrate 21 on which the growth of the semiconductor layers is completed is unloaded to the outside of the chamber.

According to the illustrated exemplary embodiment, a wafer including a heterostructure suitable for manufacturing a near-ultraviolet or blue light emitting diode is manufactured. Various types of light emitting diodes such as lateral, vertical, or flip-chip type light emitting diodes may be fabricated using the semiconductor layers grown on the substrate 21.

In the illustrated exemplary embodiment, the lower n-type semiconductor layer 23, the active layer 25, the electron blocking layer 26, the p-type semiconductor layer 27, the high-concentration p-type semiconductor layer 28, the high-concentration n-type semiconductor layer 29, and the upper n-type semiconductor layer 30 are grown on the substrate 21 in an in-situ process without vacuum breaking of the chamber. Accordingly, an oxygen concentration remaining at an interface of these layers is substantially same. In particular, after the p-type semiconductor layer 27 or the high-concentration p-type semiconductor layer 28 is grown, since the high-concentration n-type semiconductor layer 29 is grown without vacuum breaking, oxygen concentrations on an upper surface and a lower surface of the high-concentration n-type semiconductor layer 29 are substantially same.

Figure 3:
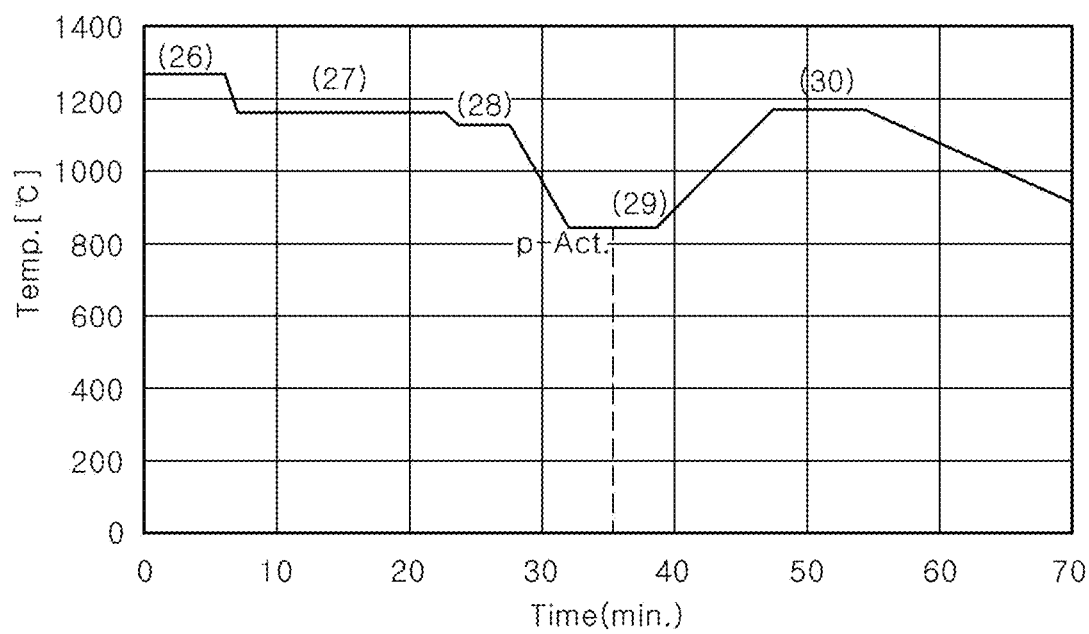
FIG. 3 is a schematic graph illustrating a method of fabricating a heterostructure for a light emitting diode according to another exemplary embodiment of the present disclosure.

The method of fabricating the heterostructure for the light emitting diode described with reference to FIG. 2 is suitable for the near-ultraviolet or blue light emitting diode, and a method of fabricating a heterostructure for a deep ultraviolet light emitting diode will be described with reference to FIG. 3. FIG. 3 is a schematic graph illustrating a method of fabricating a heterostructure for a light emitting diode according to another exemplary embodiment of the present disclosure.

FIG. 3 shows growth temperatures of each layer from an electron blocking layer 26 over time, omitting processes before the electron blocking layer 26.

A substrate 21 is disposed in a chamber. The chamber can be pumped in a high vacuum, and various source gases and carrier gases for growing a nitride-based semiconductor layer on the substrate 21 may be supplied into the chamber. In addition, the substrate 21 may be heated to reach a set temperature in the chamber.

As described above, the substrate 21 is not particularly limited as long as it is a substrate capable of growing a gallium nitride-based semiconductor layer. A lower n-type semiconductor layer 23 and an active layer 25 may be grown on the substrate 21 disposed in the chamber, and the electron blocking layer 26 may be grown on the active layer 25. The lower n-type semiconductor layer 23 and the active layer 25 suitable for generating deep UV light are grown, and the active layer 25 may include an AlGaN or AlInGaN well layer for generating deep UV light.

The electron blocking layer 26 may be formed of an AlGaN layer or an AlInGaN layer having a wider band gap than that of the active layer 25. To grow the electron blocking layer 26, an $N_2$ gas may be supplied as a carrier gas together with various source gases, and a supply of $H_2$ gas may be blocked so as not to damage a crystal quality of the active layer 25. An Al molar ratio in the electron blocking layer 26 may be 0.75 or more, further, 0.8 or more, and thus, a growth temperature of the electron blocking layer 26 may be 1200° C. or more. As used herein, the molar ratio of a group III element corresponds to a ratio of the group III element to all of the group III elements present in the layer, where the molar ratios for all of the group III elements in the layer are between zero and one and sum to one.

After the electron blocking layer 26 is grown, a temperature of the chamber may be lowered, and a p-type semiconductor layer 27 may be grown at a temperature lower than a growth temperature of the electron blocking layer 26. The p-type semiconductor layer 27 may be grown as, for example, a GaN layer or an AlGaN layer. In particular, the p-type semiconductor layer 27 may be formed of a nitride semiconductor layer having a band gap wider than that of the well layer so as to transmit ultraviolet light generated in the active layer 25. While the p-type semiconductor layer 27 is grown, the $N_2$ gas and the $H_2$ gas may be supplied together with the source gas.

A high-concentration p-type semiconductor layer 28 may be grown on the p-type semiconductor layer 27. The high-concentration p-type semiconductor layer 28 may be formed so as to have a higher p-type dopant concentration than that of the p-type semiconductor layer 27. The high-concentration p-type semiconductor layer 28 may be formed of a same composition as that of the p-type semiconductor layer 27, for example, a GaN layer or an AlGaN layer. However, the high-concentration p-type semiconductor layer 28 may be grown at a same or lower temperature than a growth temperature of the p-type semiconductor layer 27. The high-concentration p-type semiconductor layer 28 may be omitted.

After the high-concentration p-type semiconductor layer 28 is grown, the temperature of the chamber is lowered to a temperature (first temperature) lower than growth temperatures of the p-type semiconductor layer 27 and the high-concentration p-type semiconductor layer 28. The first temperature may be a temperature for activating a p-type dopant, for example, Mg, of the p-type semiconductor layer 27 or the high-concentration p-type semiconductor layer 28. For example, when the p-type semiconductor layer 27 is an AlGaN layer, the first temperature may be higher than 800° C. and lower than 1000° C. After the temperature of the chamber is lowered to the first temperature, the substrate is maintained in the chamber during a first time in a state in which the $N_2$ gas is supplied and the supplies of the $H_2$ gas and the $NH_3$ gas are blocked. The first time may vary depending on the first temperature, and may be maintained for about 2 to 10 minutes.

After the p-type semiconductor layer 27 or the high-concentration p-type semiconductor layer 28 is grown, by maintaining the substrate 21 at the first temperature during the first time, the p-type dopant in the p-type semiconductor layer 27 and/or the high-concentration p-type semiconductor layer 28 may be activated, and hydrogen may be released from these layers 27 and 28. Hydrogen prevents the activation of the p-type dopant such as Mg, and Mg can be activated by releasing hydrogen.

Furthermore, by maintaining the temperature of the chamber at the first temperature during the first time, the Mg source gas attached to a chamber wall or the like may be emitted out of the chamber, thereby reducing a memory effect that Mg is doped during deposition of a subsequent layer.

Thereafter, a high-concentration n-type semiconductor layer 29 is grown on the high-concentration p-type semiconductor layer 28 in which the p-type dopant is activated. The high-concentration n-type semiconductor layer 29 may be grown at the first temperature, but the inventive concepts are not limited thereto. Further, the supply of hydrogen gas into the chamber may be blocked so as to prevent hydrogen from being introduced into the high-concentration p-type semiconductor layer 28 while the high-concentration n-type semiconductor layer 29 is grown. The high-concentration n-type semiconductor layer 29 may be formed of, for example, a GaN layer or an AlGaN layer, and may be formed to have a higher doping concentration than the lower n-type semiconductor layer 23.

An upper n-type semiconductor layer 30 is grown on the high-concentration n-type semiconductor layer 29. After the high-concentration n-type semiconductor layer 29 is grown, the temperature of the chamber may be elevated. The temperature of the chamber may be, for example, elevated to a temperature higher than the growth temperature of the p-type semiconductor layer 27, and source gases and carrier gases are supplied into the chamber at the elevated temperature so that the upper n-type semiconductor layer 30 may be grown. At this time, the $H_2$ gas may be supplied together with the $N_2$ gas and the $NH_3$ gas. The upper n-type semiconductor layer 30 may be grown as a GaN layer or an AlGaN layer.

After the growth of the upper n-type semiconductor layer 30 is completed, the temperature of the chamber is lowered, e.g., to room temperature, and the substrate 21 on which the growth of the semiconductor layers is completed is unloaded to the outside of the chamber.

According to the illustrated exemplary embodiment, a wafer including a heterostructure suitable for manufacturing a deep ultraviolet light emitting diode is manufactured. Various types of light emitting diodes such as lateral, vertical, or flip-chip type light emitting diodes may be fabricated using the semiconductor layers grown on the substrate 21.

In the illustrated exemplary embodiment, the lower n-type semiconductor layer 23, the active layer 25, the electron blocking layer 26, the p-type semiconductor layer 27, the high-concentration p-type semiconductor layer 28, the high-concentration n-type semiconductor layer 29, and the upper n-type semiconductor layer 30 are grown on the substrate 21 in an in-situ process without vacuum breaking of the chamber. Accordingly, an oxygen concentration remaining at an interface of these layers is substantially same. In particular, after the p-type semiconductor layer 27 or the high-concentration p-type semiconductor layer 28 is grown, since the high-concentration n-type semiconductor layer 29 is grown without vacuum breaking, oxygen concentrations on an upper surface and a lower surface of the high-concentration n-type semiconductor layer 29 are substantially same.

In the illustrated exemplary embodiment, the p-type semiconductor layer 27, the high-concentration p-type semiconductor layer 28, the high-concentration n-type semiconductor layer 29, and the upper n-type semiconductor layer 30 may be formed of a nitride semiconductor layer capable of transmitting light generated in the active layer 25, for example, an AlGaN layer. Since a conventional deep ultraviolet light emitting diode forms an ohmic contact layer on the p-type semiconductor layer 27, it is difficult to form the p-type semiconductor layer 27 of an AlGaN layer. However, in the illustrated exemplary embodiment, since the ohmic contact layer is formed on the upper n-type semiconductor layer 30, all of the p-type semiconductor layer 27, the high-concentration p-type semiconductor layer 28, the high-concentration n-type semiconductor layer 29, and the upper n-type semiconductor layer 30 may be formed of a nitride semiconductor layer having a relatively wider band gap than that of the active layer 25, such as an AlGaN layer. Accordingly, it is possible to provide a light emitting diode having a significantly improved luminous efficiency compared to the conventional deep ultraviolet light emitting diode.

As used herein, two materials can have comparable compositions when the molar ratios of the corresponding materials differ by at most ten percent (five percent in a more specific embodiment). For example, consider two group III nitride materials, $Al_xGa_yIn_zB_{1-x-y-z}N$ and $Al_{x'}$, $Ga_{y'}$, $In_{z'}$, $B_{1-x'-y'-z'}N$. The two materials have comparable compositions when each of the molar fractions x, y, and z differs from the corresponding molar fractions x', y', and z' by less than ten percent, where the percentage is calculated by taking a difference between the molar fractions and dividing the value by the higher molar fraction.

Compositions of two semiconductor layers also can be evaluated in conjunction with the corresponding band gaps. In this case, as used herein, compositions of two semiconductor layers are the same when the band gaps of the two semiconductor layers differ by less than the thermal energy unit, kT. The compositions of two semiconductor layers are substantially the same when the band gaps of the two semiconductor layers differ by less than three times the thermal energy unit, 3kT. A composition of a first semiconductor layer is considered larger than a composition of a second semiconductor layer when the band gap of the first semiconductor layer is wider than the band gap of the second semiconductor layer by more than the thermal energy unit, kT. A composition of a first semiconductor layer is considered substantially larger than a composition of a second semiconductor layer when the band gap of the first semiconductor layer is wider than the band gap of the second semiconductor layer by more than three times the thermal energy unit, 3kT. Unless otherwise specified, the thermal energy unit is approximated as 0.026 eV. For a given layer, the band gap of the layer can correspond to an average band gap computed over the height of the layer.

Any of the various layers of the heterostructure can comprise a substantially uniform composition or a graded composition. For example, a layer can comprise a graded composition at a heterointerface with another layer, in which the molar ratio of one or more group III elements in the layer is increased/decreased over a vertical distance within the layer. In an embodiment, the electron blocking layer 26 can have a graded composition, e.g., to provide a transition between the compositions of the electron blocking layer 26 and one or both of the adjacent active layer 25 and p-type semiconductor layer 27. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

In an illustrative embodiment, the lower n-type semiconductor layer 23 can have an index of refraction that is greater than an index of refraction of the active layer 25, which is in turn greater than an index of refraction of the electron blocking layer 26 and/or the p-type semiconductor layer 27. Having such a configuration of indexes of refractions can eliminate total internal reflection (TIR) which can occur between these layers. As used herein, an index of refraction for a layer comprises an average index of refraction taken over the entire layer. As also used herein, an effective index of refraction is the realizable index of refraction for a layer or region having a multiple of sublayers, interlayers, or the like, that is obtained by taking into account each of the respective indexes of refraction of all of the sublayers or interlayers that form the layer or region. As an example, an ellipsometer can be used to measure experimentally the indexes of refraction of all of the sublayers or interlayers in a layer or region in order to derive an effective index of refraction.

In order to further improve control of the indexes of refraction of the semiconductor layers in the semiconductor heterostructure, additional semiconductor materials can be added to the semiconductor layers to attain desired indexes of refraction by enhancing electrical and optical properties of the layers. In one embodiment, boron nitride (BN) can be added to any of the semiconductor layers of the semiconductor heterostructure. Adding smaller fraction amounts of BN to a group III nitride-based semiconductor layer in the semiconductor heterostructure will not significantly affect the band gap of the semiconductor layer, but such additions can have notable decreases in the index of refraction of the semiconductor layers. For example, a slight addition of BN to AlN and GaN layers can result in significant decreases in the indexes of refraction of the semiconductor layers.

In one embodiment, BN can be added to an active region having barriers and quantum wells. In particular, a molar fraction of BN can be added to the barriers and/or the quantum wells of the active region, with the amount of the BN that is utilized including a molar ratio that preserves a targeted radiation wavelength specified for the light emitting diode incorporating the semiconductor heterostructure. In one embodiment, a semiconductor heterostructure that includes a p-type layer with interlayers can include a molar fraction of BN in the interlayers. Similarly, a semiconductor heterostructure that includes a p-type superlattice of barriers can include BN in least one of the barriers. The control and improvement of the indexes of refraction of the semiconductor layers of the semiconductor heterostructure are not limited to the addition of BN, but can include adding molar fractions of other materials and compounds such as boron (B) and indium nitride (InN).

Figure 4:
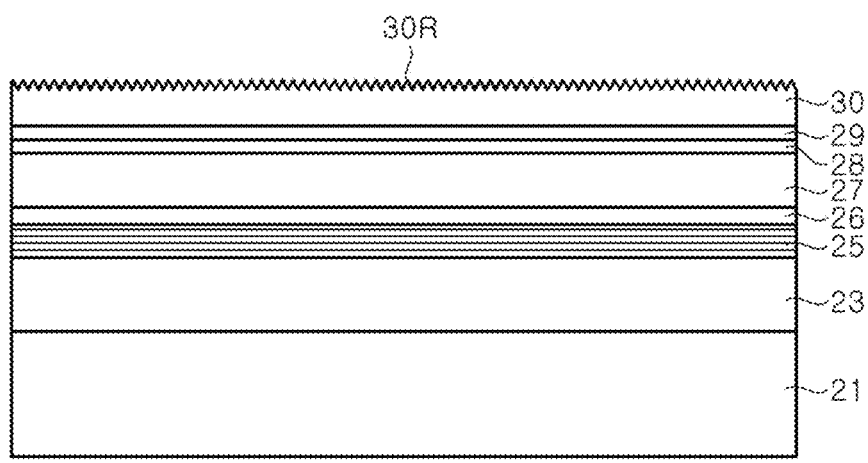
FIG. 4 is a schematic cross-sectional view illustrating a heterostructure for a light emitting diode according to another exemplary embodiment of the present disclosure.

FIG. 4 is a schematic cross-sectional view illustrating a heterostructure for a light emitting diode according to another exemplary embodiment of the present disclosure.

Referring to FIG. 4, the heterostructure for the light emitting diode according to the illustrated exemplary embodiment is substantially similar to the heterostructure for the light emitting diode described with reference to FIG. 1, except that an upper n-type semiconductor layer 30 has a roughened surface 30R.

A surface of the upper n-type semiconductor layer 30 may be etched using a chemical etching technique such as, for example, photo-enhanced chemical etching, and thus, the roughened surface 30R may be formed on a surface of the upper n-type semiconductor layer 30. The roughened surface 30R reduces a total internal reflection to improve a light extraction efficiency.

Figure 5:
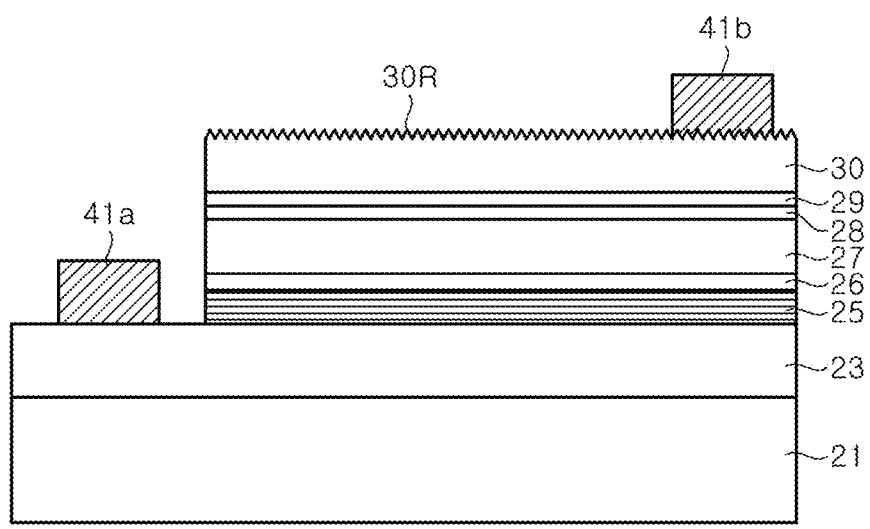
FIG. 5 is a schematic cross-sectional view illustrating a lateral-type light emitting diode according to an exemplary embodiment of the present disclosure.

In the heterostructures for the light emitting diode described with reference to FIG. 1 and FIG. 4, a plurality of semiconductor layers are grown on a substrate 21, and light emitting diodes having various structures may be fabricated using these semiconductor layers. FIG. 5 is a schematic cross-sectional view illustrating a lateral-type light emitting diode according to an exemplary embodiment of the present disclosure.

Referring to FIG. 5, an upper n-type semiconductor layer 30, a high-concentration n-type semiconductor layer 29, a high-concentration p-type semiconductor layer 28, a p-type semiconductor layer 27, an electron blocking layer 26, and an active layer 25 may be etched to expose a lower n-type semiconductor layer 23. A first contact layer 41a may be formed on the exposed lower n-type semiconductor layer 23, and a second contact layer 41b may be formed on the upper n-type semiconductor layer 30.

Since the first contact layer 41a and the second contact layer 41b are formed on the lower and upper n-type semiconductor layers 23 and 30, respectively, the first contact layer 41a and the second contact layer 41b may include a same ohmic contact layer. Furthermore, the first contact layer 41a and the second contact layer 41b may be formed together in a same process as a same material layer.

Figure 6A:
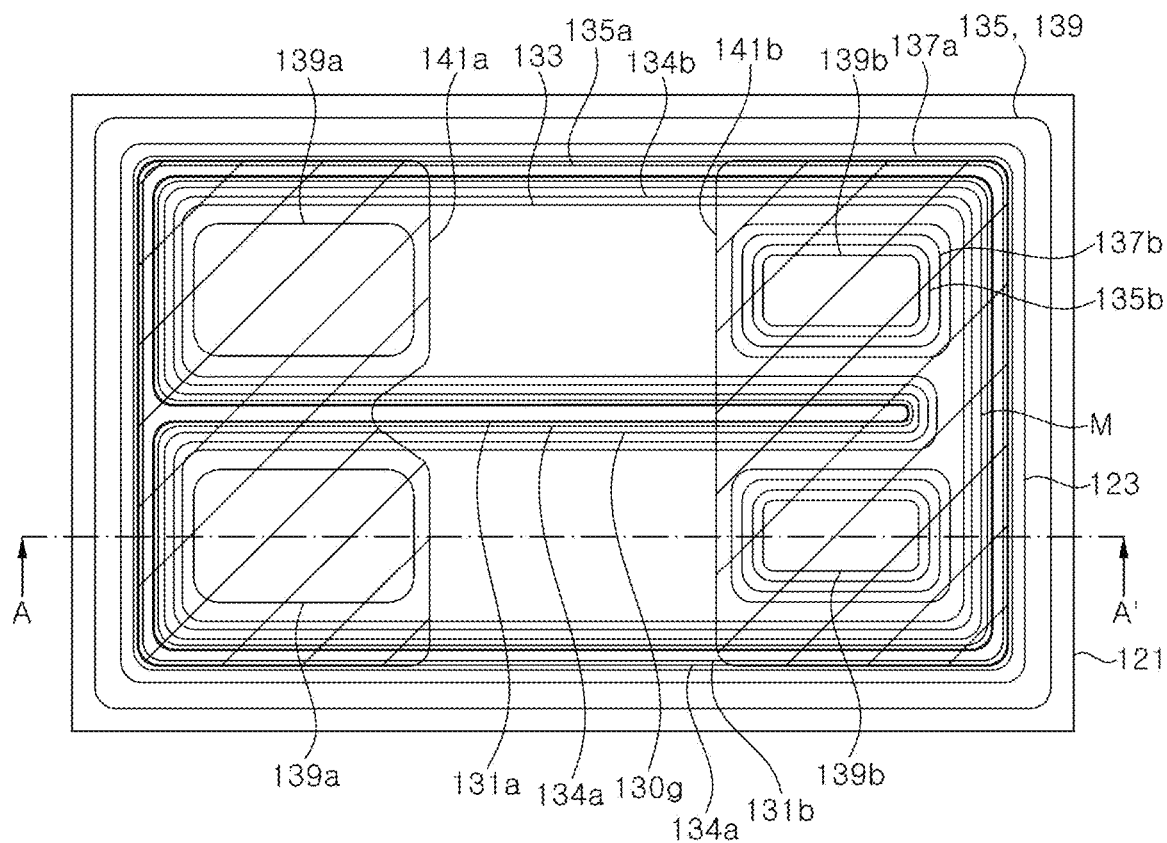
FIG. 6A is a schematic plan view illustrating a light emitting diode according to an exemplary embodiment of the present disclosure.
Figure 6B:
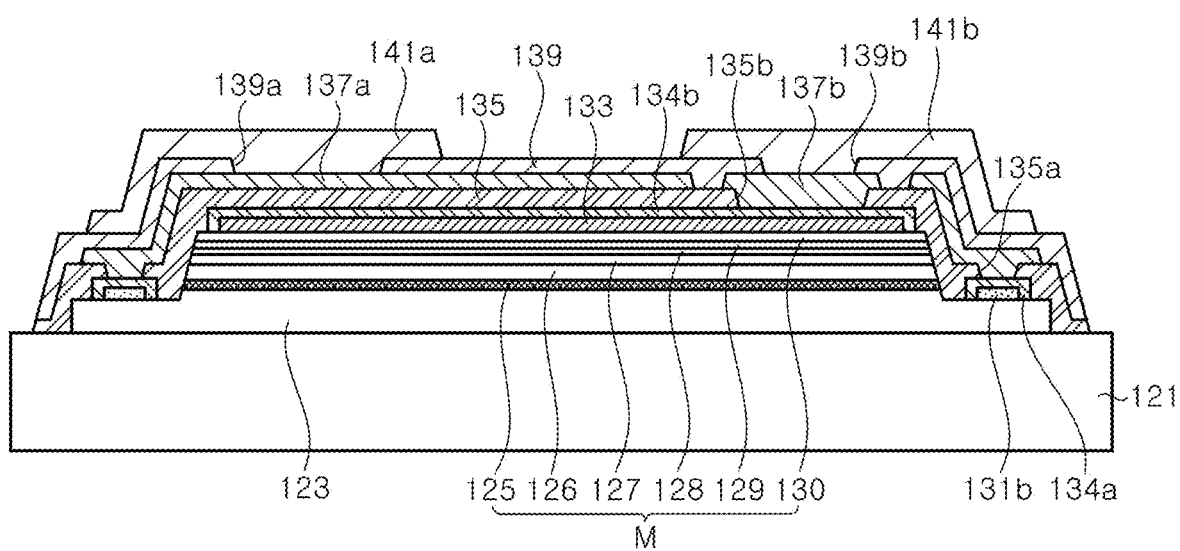
FIG. 6B is a schematic cross-sectional view taken along line A-A' of its corresponding view shown in FIG. 6A.

FIG. 6A is a schematic plan view illustrating a light emitting diode according to an exemplary embodiment of the present disclosure, and FIG. 6B is a schematic cross-sectional view taken along line A-A' of its corresponding view shown in FIG. 6A. The light emitting diode described herein has a flip-chip type light emitting diode structure, and is particularly suitable for a deep ultraviolet light emitting diode.

Referring to FIG. 6A and FIG. 6B, a ultraviolet light emitting diode according to the illustrated exemplary embodiment may include a substrate 121, a lower n-type semiconductor layer 123, an active layer 125, an electron blocking layer 126, and a p-type semiconductor layer 127, a high-concentration p-type semiconductor layer 128, a high-concentration n-type semiconductor layer 129, an upper n-type semiconductor layer 130, lower n-ohmic contact layers 131a and 131b, an upper n-ohmic contact layer 133, a first capping layer 134a, a second capping layer 134b, a lower insulation layer 135, a first pad metal layer 137a, a second pad metal layer 137b, an upper insulation layer 139, a first bump 141a, and a second bump 141b.

Since the substrate 121 is same as the substrate 21 described with reference to FIG. 1, a detailed description thereof will be omitted to avoid redundancy.

The lower n-type semiconductor layer 123 is disposed on the substrate 121. The lower n-type semiconductor layer 123 is substantially similar to the lower n-type semiconductor layer 23 described with reference to FIG. 1. However, edges of the lower n-type semiconductor layer 123 may be located inside a region surrounded by edges of the substrate 121, and thus, an upper surface of the substrate 121 may be exposed along the edges of the n-type semiconductor layer 123.

A mesa M is disposed on a partial region of the lower n-type semiconductor layer 123. The mesa M may include the active layer 125, the electron blocking layer 126, the p-type semiconductor layer 127, the high-concentration p-type semiconductor layer 128, the high-concentration n-type semiconductor layer 129, and the upper n-type semiconductor layer 130. The electron blocking layer 126 and/or the high-concentration p-type semiconductor layer 128 may be omitted. The mesa M can be formed by patterning the semiconductor layers 126, 127, 128, 129, and 130 grown on the lower n-type semiconductor layer 123 through a mesa etching process.

Since the active layer 125, the electron blocking layer 126, the p-type semiconductor layer 127, the high-concentration p-type semiconductor layer 128, the high-concentration n-type semiconductor layer 129, and the upper n-type semiconductor layer 130 are similar to those described with reference to FIG. 1, detailed descriptions thereof will be omitted to avoid redundancy.

The mesa M may have a rectangular shape elongated in one direction, and may include a groove 130g exposing the n-type semiconductor layer 123. The groove 130g may extend along a longitudinal direction of the mesa M. As shown in FIG. 6A, the groove 130g may extend from one edge of the mesa M toward the other edge along the longitudinal direction of the mesa M. Mesa regions are disposed on both sides of the groove 130g by the groove 130g. A length of the groove 130g may exceed ½ of a length of the mesa M. In other words, the length of the groove 130g is greater than a distance between an inner end of the groove 130g and the other edge of the mesa M. Furthermore, the distance between the inner end of the groove 130g and the other edge of the mesa M may be smaller than a width of the mesa region disposed on both sides of the groove 130g.

The groove 130g may have a linear shape, and the mesa M may have a symmetrical structure with respect to a straight line passing through a center of the light emitting diode and parallel to the groove 130g.

Meanwhile, corners of the mesa M may have a curved shape. The edge of the mesa M may include a straight region and curved regions disposed on both sides thereof. By forming a corner portion of the mesa M to be curved, light may be prevented from being condensed at the corner portion and from being lost due to light absorption.

Meanwhile, the lower n-ohmic contact layer 131a is disposed on the n-type semiconductor layer 123 exposed by the groove 130g. The lower n-ohmic contact layer 131b is disposed on the n-type semiconductor layer 123 exposed along a periphery of the mesa M. The lower n-ohmic contact layer 131a may be connected to the lower n-ohmic contact layer 131b, but the inventive concepts are not limited thereto. The lower n-ohmic contact layers 131a and 131b may be spaced apart from the mesa M to surround the mesa M.

The lower n-ohmic contact layers 131a and 131b may be formed by depositing a plurality of metal layers, and thereafter, forming the metal layers through a rapid thermal alloy process (RTA). For example, Cr/Ti/Al/Ti/Au may be sequentially deposited on the lower n-ohmic contact layers 131*a* and 131*b*, and thereafter, alloyed through the RTA process. Accordingly, the lower n-ohmic contact layers 131*a* and 131*b* become alloy layers containing Cr, Ti, Al, and Au.

The upper n-ohmic contact layer 133 is disposed on the upper n-type semiconductor layer 130 to be in ohmic contact with the upper n-type semiconductor layer 130. The upper n-ohmic contact layer 130 may be formed of a same metal layer as those of the lower n-ohmic contact layers 131*a* and 131*b*, but the inventive concepts are not necessarily limited thereto. The upper n-ohmic contact layer 133 is in ohmic contact with the upper n-type semiconductor layer 130, and covers most of an upper region of the mesa M, for example, 80% or more.

The first capping layer 134*a* may cover upper surfaces and side surfaces of the lower n-ohmic contact layers 131*a* and 131*b*. The second capping layer 134*b* may cover an upper surface and side surfaces of the upper n-ohmic contact layer 133. The first capping layer 134*a* and the second capping layer 134*b* prevent the lower n-ohmic contact layers 131*a* and 131*b* and the upper n-ohmic contact layer 133 from being damaged by etching or oxidation, respectively. The first capping layer 134*a* and the second capping layer 134*b* may be formed of a same metal in a same process. For example, the first capping layer 134*a* and the second capping layer 134*b* may be formed of Ti/Au/Ti.

The lower insulation layer 135 covers the mesa M and covers the first capping layer 134*a* and the second capping layer 134*b*. The lower insulation layer 135 also covers the n-type semiconductor layer 123 exposed around the mesa M and in the groove 130*g*. Furthermore, the lower insulation layer 135 may cover a portion of the substrate 121 exposed around the n-type semiconductor layer 123. Meanwhile, the lower insulation layer 135 has openings 135*a* for allowing electrical connection to the lower n-ohmic contact layers 131*a* and 131*b* and openings 135*b* for allowing electrical connection to the upper n-ohmic contact layer 133. The opening 135*a* may have a shape similar to that of the lower n-ohmic contact layers 131*a* and 131*b* or the first capping layer 134*a*. That is, the opening 135*a* may surround the mesa M and also extend into the groove 130*g*. A width of the opening 135*a* may be smaller than that of the first capping layer 134*a*, and thus, the n-type semiconductor layer 123 may not be exposed through the opening 135*a*. Meanwhile, the opening 135*b* is disposed in the upper region of the mesa M and exposes the second capping layer 134*b*. A plurality of openings 135*b* may be disposed on the second capping layer 134*b*. In particular, the openings may be symmetrically disposed on both sides of the groove 130*g*.

The lower insulation layer 135 may be formed of, for example, $SiO_2$, without being limited thereto, and may be formed as a distributed Bragg reflector. In particular, the lower insulation layer 135 may be formed to constitute an omni-directional reflector (ODR). For example, the lower insulation layer 135 may be formed of $SiO_2$ having a thickness of about 10,000 Å.

Meanwhile, the first pad metal layer 137*a* and the second pad metal layer 137*b* are disposed on the lower insulation layer 135. The first pad metal layer 137*a* and the second pad metal layer 137*b* may be formed together in a same process as a same metal layer and disposed on a same level, that is, on the lower insulation layer 135. The first and second pad metal layers 137*a* and 137*b* may include, for example, an Al layer.

The first pad metal layer 137*a* is electrically connected to the lower n-ohmic contact layers 131*a* and 131*b* through the opening 135*a* of the lower insulation layer 135. The first pad metal layer 137*a* may directly contact the first capping layer 134*a* through the opening 135*a* of the lower insulation layer 135. The first pad metal layer 137*a* may cover most of the region of the mesa M, and may also cover a region around the mesa M. The first pad metal layer 137*a* may constitute the ODR together with the lower insulation layer 135.

Meanwhile, the second pad metal layer 137*b* may be electrically connected to the upper n-ohmic contact layer 133 through the opening 135*b* of the lower insulation layer 135. The second pad metal layers 137*b* may cover each of the openings 135*b*. Each of the second pad metal layers 137*b* may be surrounded by the first pad metal layer 137*a*. The second pad metal layers 137*b* may be disposed within the upper region of the mesa M. In the illustrated exemplary embodiment, all sides of the mesa M are covered with the first pad metal layer 137*a*. Accordingly, it is possible to prevent light loss from occurring on the sides of the mesa M.

The upper insulation layer 139 covers the first pad metal layer 137*a* and the second pad metal layer 137*b*. However, the upper insulation layer 139 may have openings 139*a* exposing the first pad metal layer 137*a* and openings 139*b* exposing the second pad metal layer 137*b*. The opening 139*a* may expose the first pad metal layer 137*a* near one edge of the mesa M, and the opening 139*b* may expose the second pad metal layer 137*b* near an opposite edge of the mesa M. The openings 139*a* and 139*b* may be symmetrically disposed with respect to a line passing through the groove 130*g*, but the inventive concepts are not limited thereto.

The upper insulation layer 139 may be formed of, for example, silicon nitride or silicon oxide.

The first bump 141*a* and the second bump 141*b* are disposed on the upper insulation layer 139. The first bump 141*a* covers the openings 139*a* and is connected to the first pad metal layer 137*a* exposed through the openings 139*a*. The first bump 141*a* is electrically connected to the lower n-type semiconductor layer 123 through the first pad metal layer 137*a* and the lower n-ohmic contact layers 131*a* and 131*b*. The first bump 141*a* and the second bump 141*b* may partially cover the sides of the mesa M.

The second bump 141*b* covers the openings 139*b* and is connected to the second pad metal layer 137*b* exposed through the openings 139*b*. The second bump 141*b* is electrically connected to the upper n-type semiconductor layer 130 through the second pad metal layer 137*b* and the upper n-ohmic contact layer 133.

The first bump 141*a* and the second bump 141*b* may include Ti/Au, and for example, may be formed of Ti/Au/Cr/Au or Ti/Ni/Ti/Ni/Ti/Ni/Ti/Au. As shown in FIG. 6A, the first bump 141*a* and the second bump 141*b* may be disposed opposite to each other, and may occupy about ⅓ of an area of the mesa M, respectively. By making the areas of the first bump 141*a* and the second bump 141*b* relatively wide, heat generated in the light emitting diode may be easily dissipated, thereby improving a performance of the light emitting diode.

Furthermore, the openings 139*a* and 139*b* are covered by the first bump 141*a* and the second bump 141*b*, and thus, moisture or solder from the outside is prevented from infiltrating through the openings 139*a* and 139*b*, thereby improving reliability.

Meanwhile, although not shown, an anti-reflection layer may be disposed on a light exiting surface of the substrate 121. The anti-reflection layer may be formed of a transparent insulation layer such as $SiO_2$, having a thickness of, for example, an integer multiple of ¼ of a wavelength of ultraviolet light. Alternatively, a bandpass filter in which layers having different refractive indices are repeatedly stacked may be used as the anti-reflection layer.

FIGS. 7A, 8A, 9A, 10A, 11A, 12A, 13A, and 14A are schematic plan views illustrating a method of fabricating a flip-chip type light emitting diode according to an exemplary embodiment of the present disclosure, and FIGS. 7B, 8B, 9B, 10B, 11B, 12B, 13B, and 14B are schematic cross-sectional views taken along line A-A' of its corresponding view shown in FIGS. 7A, 8A, 9A, 10A, 11A, 12A, 13A, and 14B, respectively.

Figure 7A:
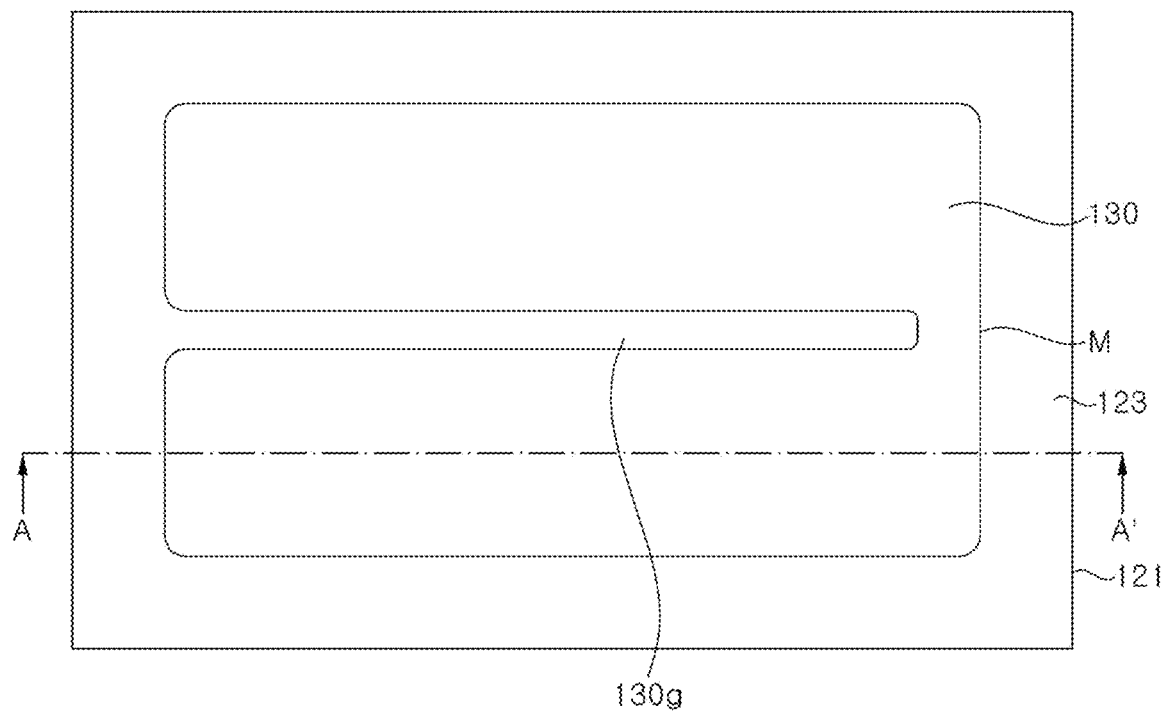
FIGS. 7A, 8A, 9A, 10A, 11A, 12A, 13A, and 14A are schematic plan views illustrating a method of fabricating a flip-chip type light emitting diode according to an exemplary embodiment of the present disclosure.
Figure 7B:
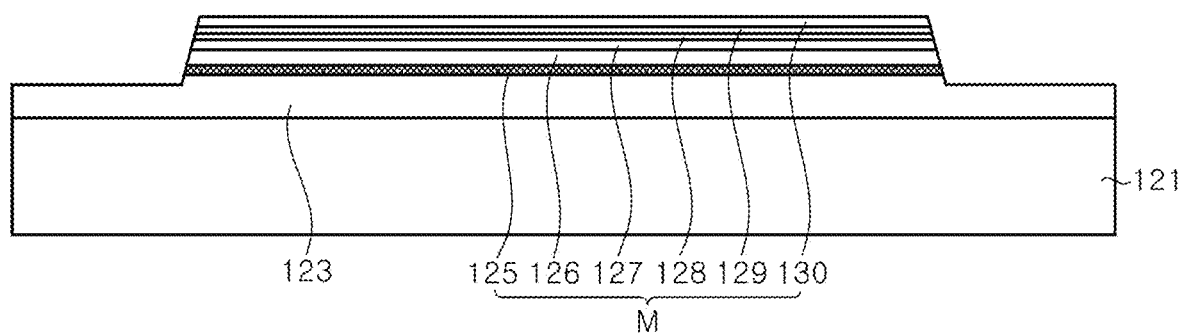
FIGS. 7B, 8B, 9B, 10B, 11B, 12B, 13B, and 14B are schematic cross-sectional views taken along line A-A' of its corresponding view shown in FIGS. 7A, 8A, 9A, 10A, 11A, 12A, 13A, and 14B, respectively.

Referring to FIG. 7A and FIG. 7B, first, a lower n-type semiconductor layer 123, an active layer 125, an electron blocking layer 126, a p-type semiconductor layer 127, a high-concentration p-type semiconductor layer 128, a high-concentration n-type semiconductor layer 129, and an upper n-type semiconductor layer 130 are grown on a substrate 121. These semiconductor layers may be grown on the substrate 121 as described with reference to FIG. 2 or FIG. 3, and detailed descriptions thereof will be omitted to avoid redundancy.

Meanwhile, a mesa M is formed by patterning the upper n-type semiconductor layer 130, the high-concentration n-type semiconductor layer 129, the high-concentration p-type semiconductor layer 128, the p-type semiconductor layer 127, the electron blocking layer 126 and the active layer 125. The mesa M may have a generally elongated rectangular shape, but is not limited to a specific shape. As the mesa M is formed, the n-type semiconductor layer 123 may be exposed along a periphery of the mesa M. Also, a groove 130g is formed inside a mesa M region. The groove 130g may extend from one edge to the other edge along a longitudinal direction of the mesa M. An inner end of the groove 130g may be disposed near the other edge. The mesa regions disposed on both sides of the groove 130g may be identical to one another other, and a width of each mesa region may be greater than or equal to a distance between the inner end of the groove 130g and the other edge of the mesa M.

Figure 8A:
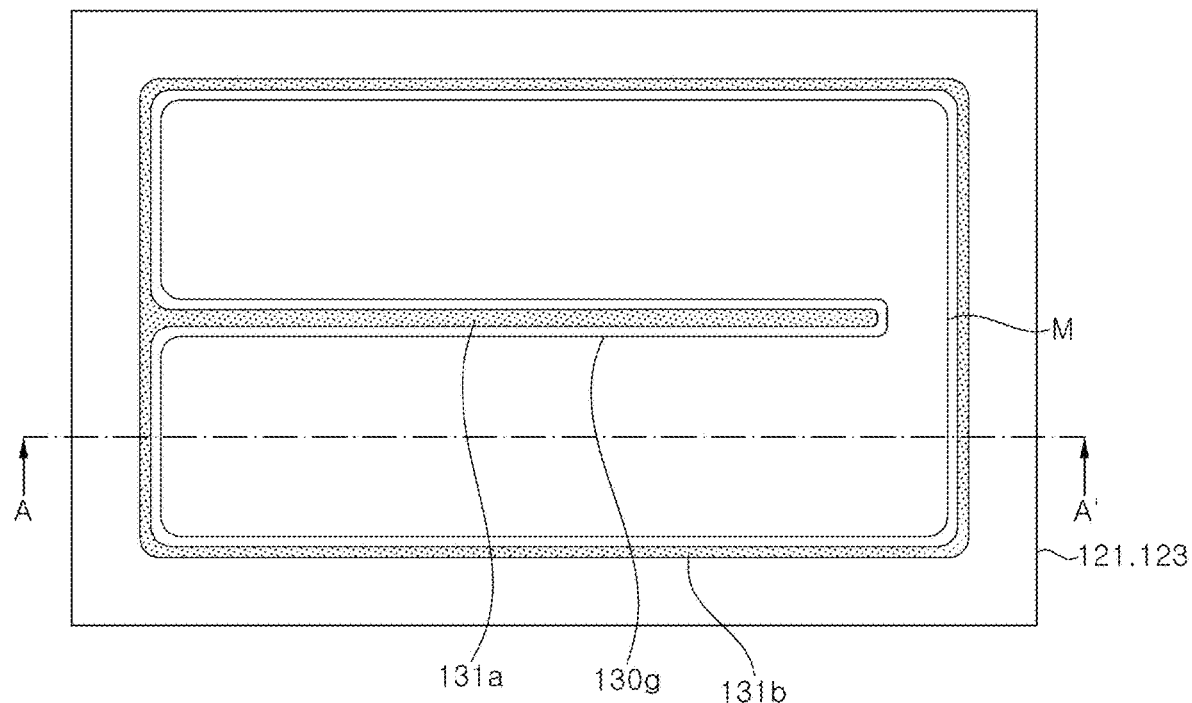
Figure 8B:
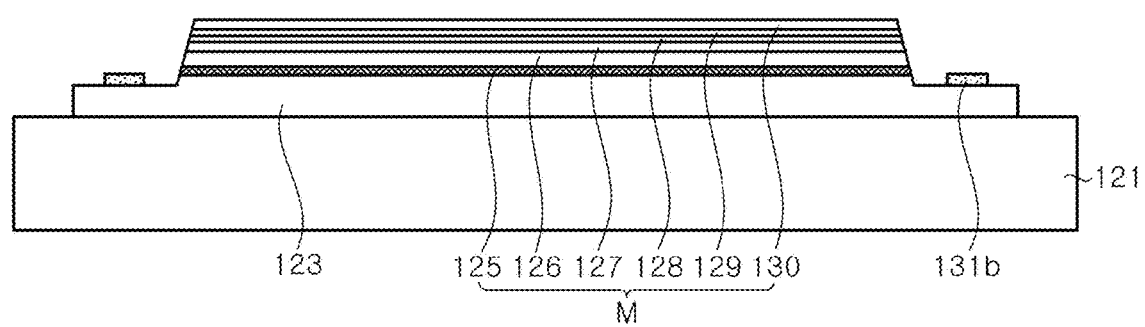

Referring to FIG. 8A and FIG. 8B, lower n-ohmic contact layers 131a and 131b are formed on the lower n-type semiconductor layer 123. The lower n-ohmic contact layers 131a and 131b may be formed by, for example, sequentially depositing Cr/Ti/Al/Ti/Au, and thereafter, alloying them through an RTA process. For example, the lower n-ohmic contact layers 131a and 131b may be alloyed through the RTA process at about 965° C. for 30 seconds. The lower n-ohmic contact layer 131a is formed on the n-type semiconductor layer 123 exposed by the groove 130g, and the lower n-ohmic contact layer 131b is formed on the n-type semiconductor layer 123 exposed around the mesa M. The lower n-ohmic contact layer 131a may extend from the lower n-ohmic contact layer 131b. By continuously forming the lower n-ohmic contact layer 131a and the lower n-ohmic contact layer 131b, current spread may be facilitated. However, the inventive concepts are not limited thereto, and the lower n-ohmic contact layer 131a may be spaced apart from the lower n-ohmic contact layer 131b.

Figure 9A:
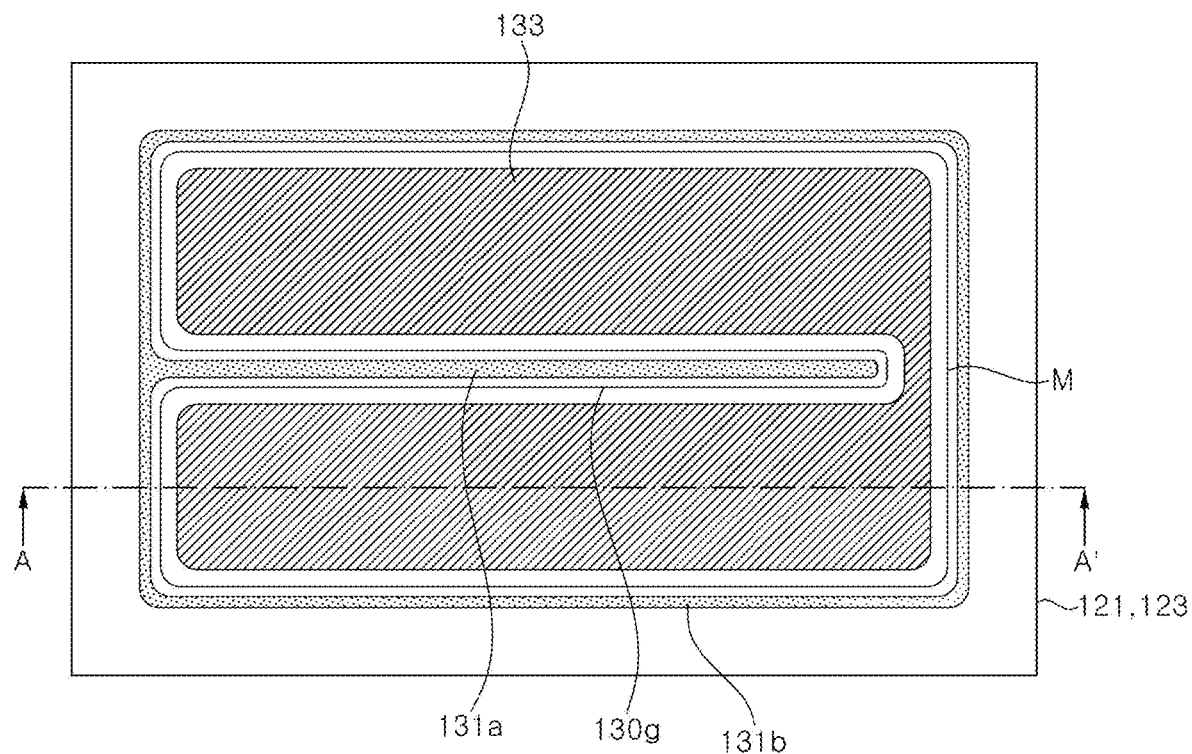
Figure 9B:
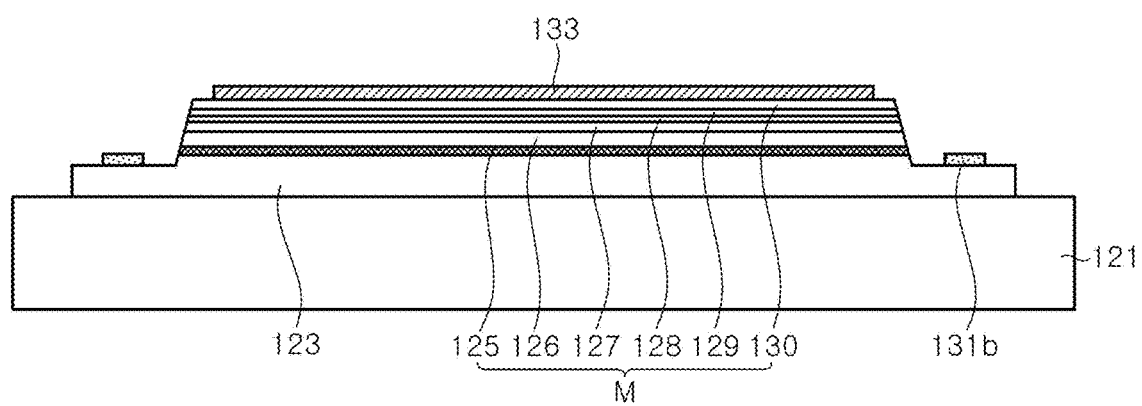

Referring to FIG. 9A and FIG. 9B, an upper n-ohmic contact layer 133 may be formed on the mesa M, e.g., after the lower n-ohmic contact layers 131a and 131b are formed. The upper n-ohmic contact layer 133 is in ohmic contact with the upper n-type semiconductor layer 130.

The upper n-ohmic contact layer 133 may include a reflection metal layer, and may be alloyed through the RTA process. The upper n-ohmic contact layer 133 may be formed of a material layer different from those of the lower n-ohmic contact layers 131a and 131b, but the inventive concepts are not limited thereto. The upper n-ohmic contact layer 133 may be formed of a same material layer together with the lower n-ohmic contact layers 131a and 131b. In addition, the upper n-ohmic contact layer 133 may be formed first, and thereafter, the lower n-ohmic contact layers 131a and 131b may be formed.

Figure 10A:
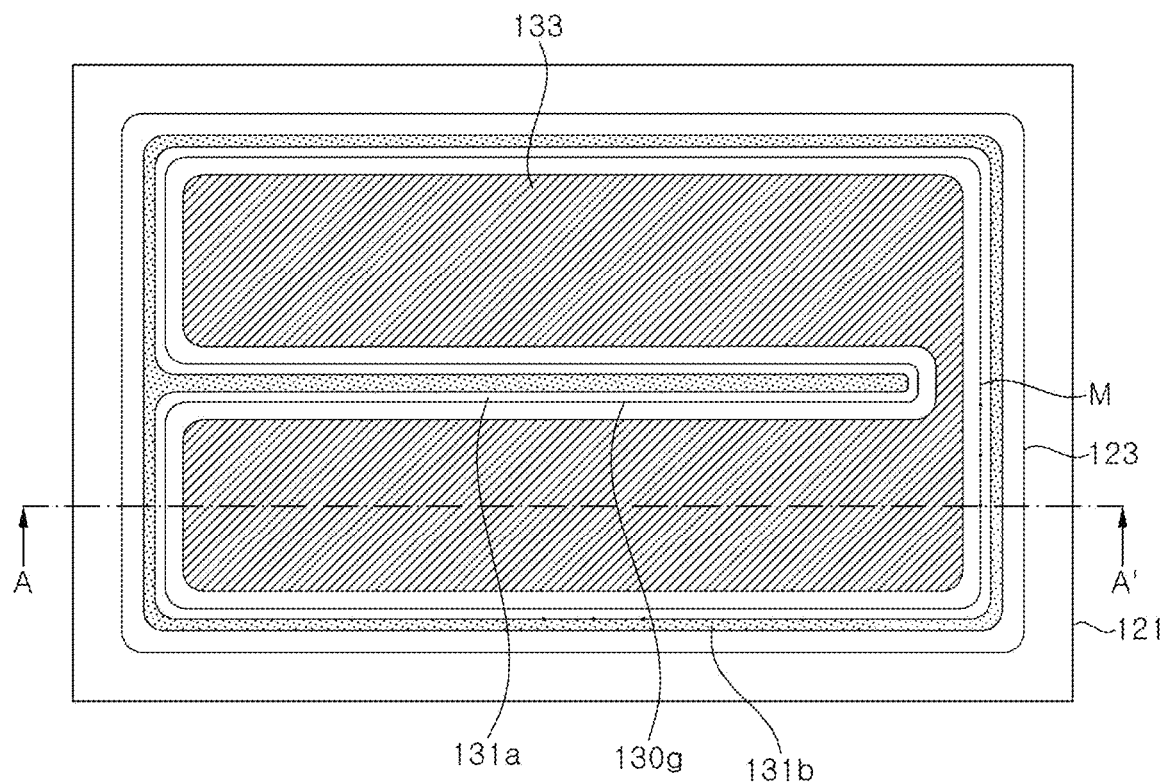
Figure 10B:
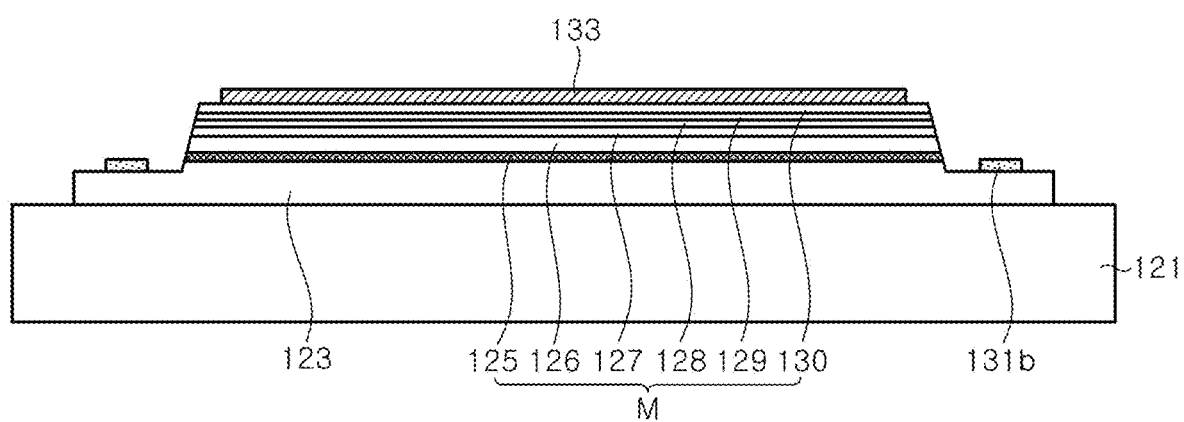

Referring to FIG. 10A and FIG. 10B, an isolation process for separating the lower n-type semiconductor layer 123 may be carried out. That is, the n-type semiconductor layer 123 between adjacent light emitting diode regions is removed to expose an upper surface of the substrate 121. By adding the isolation process, a singularization of the light emitting diodes from a wafer may be facilitated.

Figure 11A:
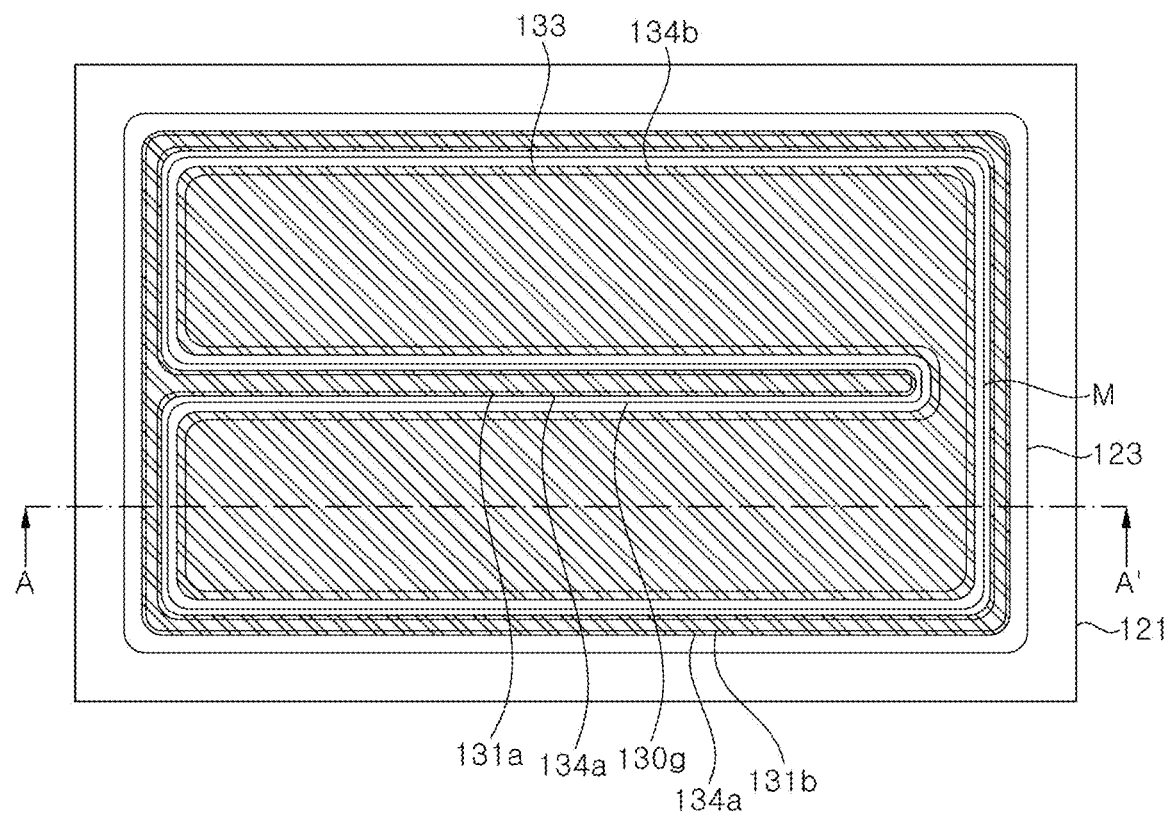
Figure 11B:
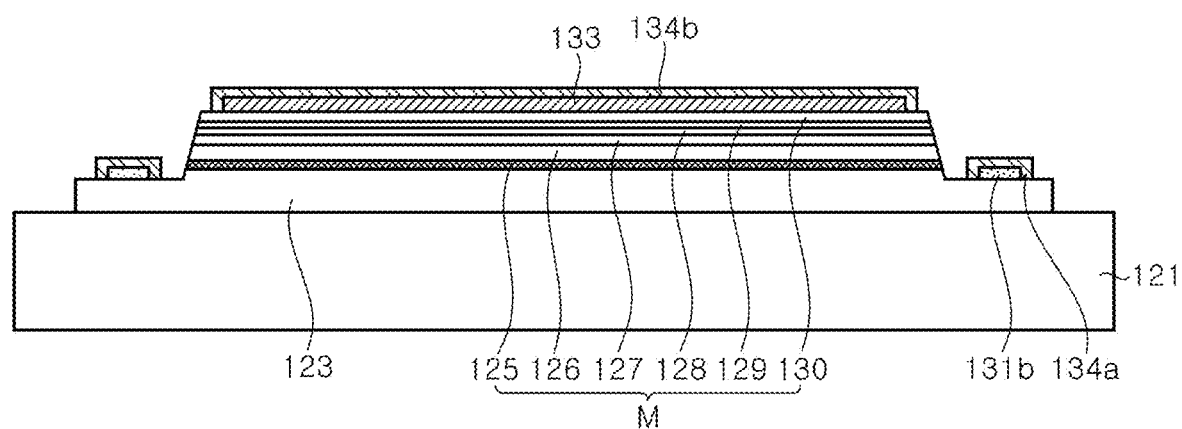

Referring to FIG. 11A and FIG. 11B, a first capping layer 134a and a second capping layer 134b are formed. The first capping layer 134a covers upper surfaces and side surfaces of the lower n-type ohmic contact layers 131a and 131b, and the second capping layer 134b covers an upper surface and side surfaces of the upper n-type ohmic contact layer 133. The first capping layer 134a and the second capping layer 134b may be formed of, for example, Ti/Au/Ti.

Figure 12A:
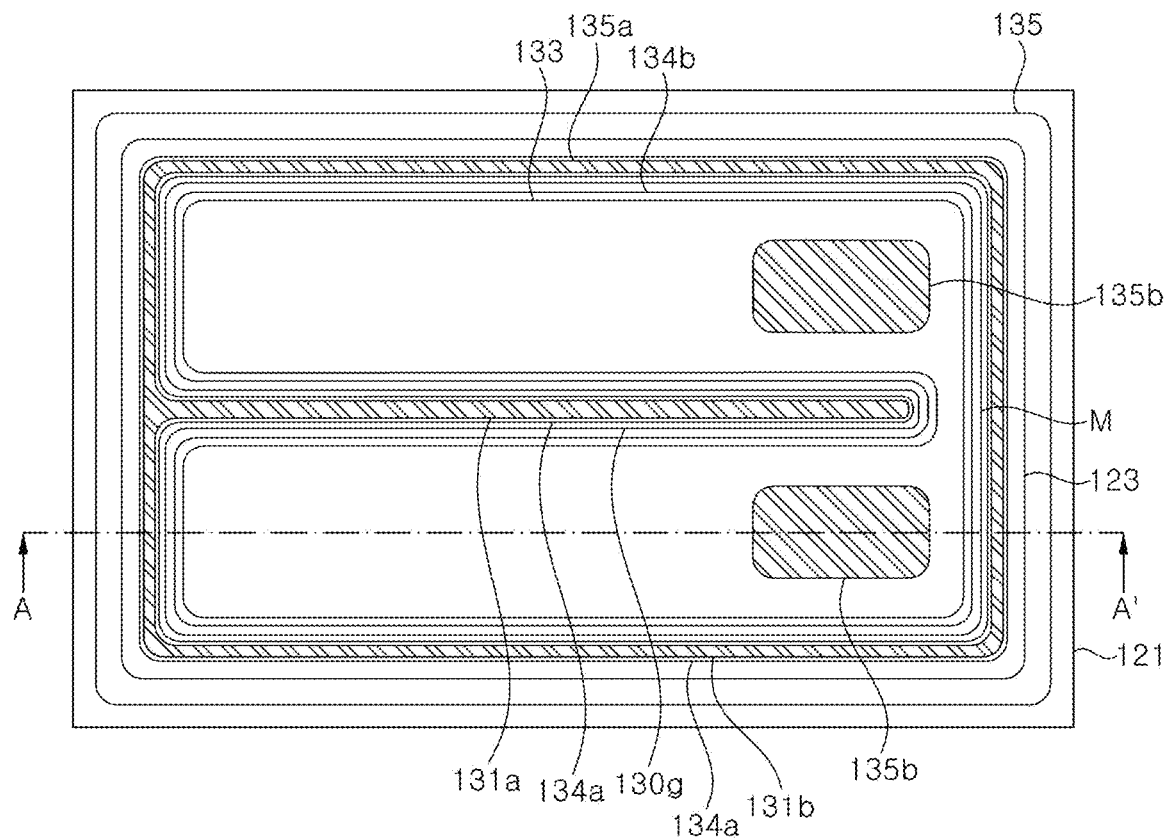
Figure 12B:
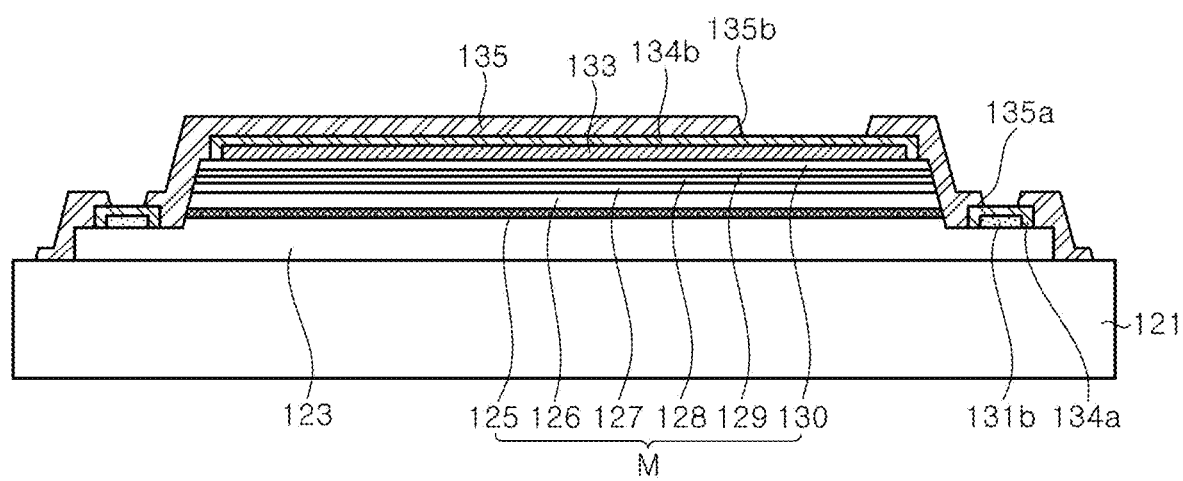

Referring to FIG. 12A and FIG. 12B, a lower insulation layer 135 covering the mesa M is formed. The lower insulation layer 135 covers side surfaces and an upper surface of the mesa M. The lower insulation layer 135 also covers the first capping layer 134a and the second capping layer 134b. The lower insulation layer 135 may cover side surfaces of the lower n-type semiconductor layer 123, and may partially cover the substrate 121 exposed around the lower n-type semiconductor layer 123. Meanwhile, the lower insulation layer 135 has openings 135a and 135b exposing the first capping layer 134a and the second capping layer 134b.

The opening 135a of the lower insulation layer 135 exposes the first capping layer 134a, and the opening 135b exposes the second capping layer 134b. A plurality of openings 135b may be formed on the second capping layer 134b. As illustrated, the openings 135b may be symmetrically disposed on both sides of the groove 130g.

Figure 13A:
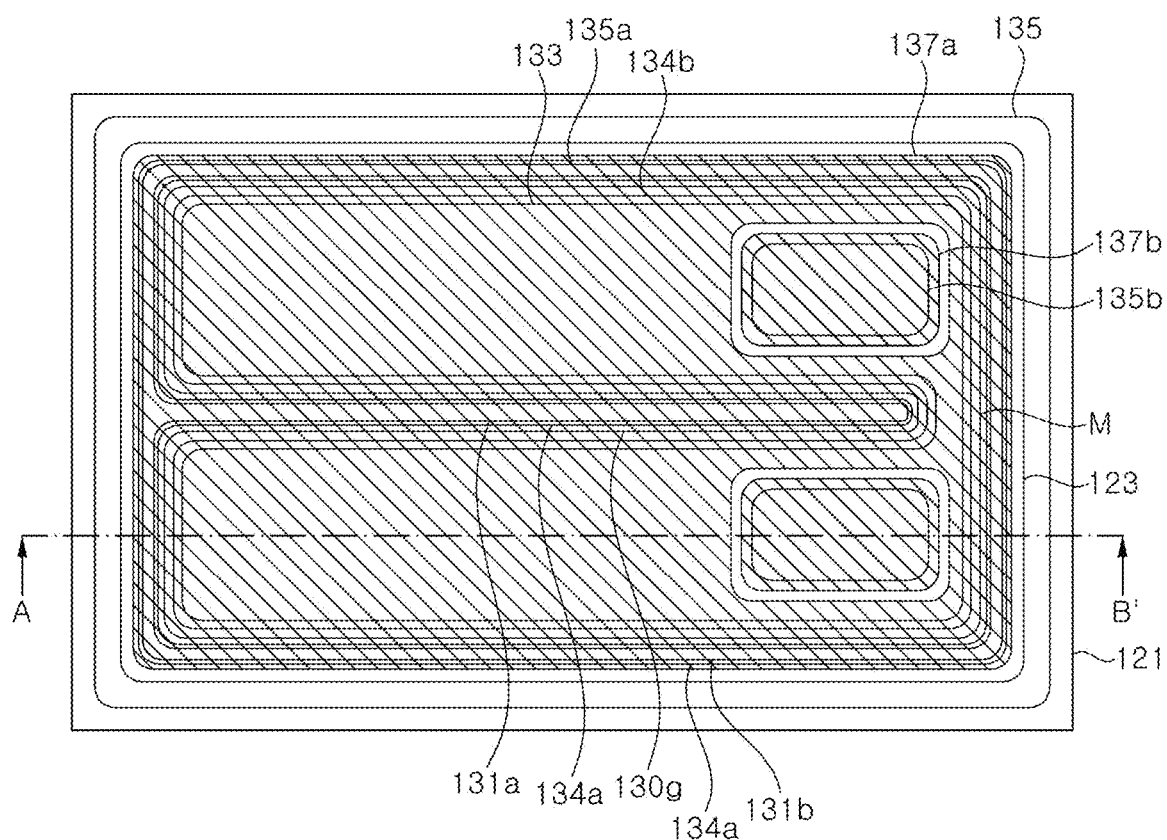
Figure 13B:
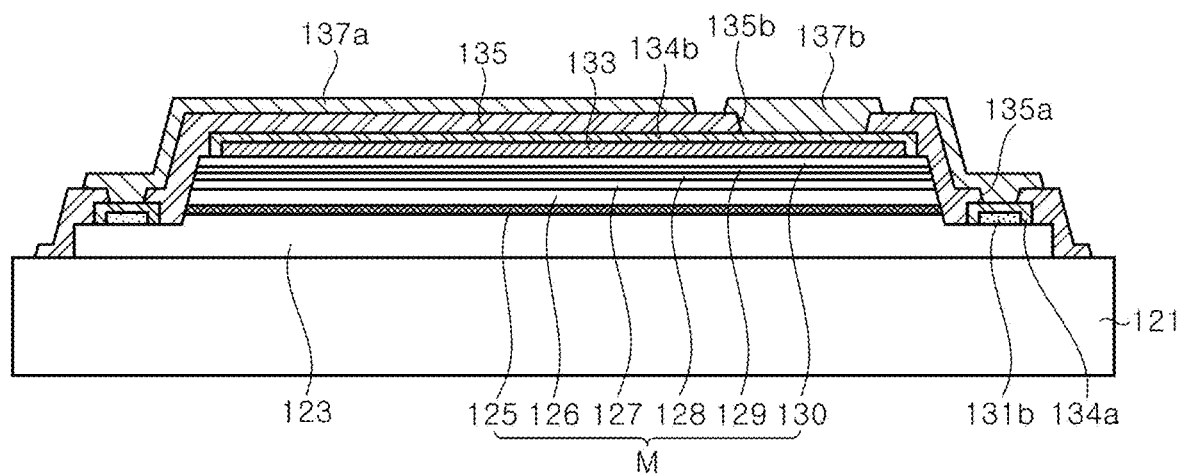

Referring to FIG. 13A and FIG. 13B, a first pad metal layer 137a and a second pad metal layer 137b are formed on the lower insulation layer 135. The first pad metal layer 137a may be electrically connected to the first capping layer 134a through the opening 135a, and the second pad metal layer 137b may be electrically connected to the second capping layer 134b through the opening 135b. As illustrated, the first pad metal layer 137a may surround the second pad metal layers 137b.

The first pad metal layer 137a may cover the opening 135a, and the second pad metal layer 137b may cover the opening 135b. In addition, the first pad metal layer 137a may continuously cover the side surfaces of the mesa M, and thus, light reflectance may be improved on the side surfaces of the mesa M.

Figure 14A:
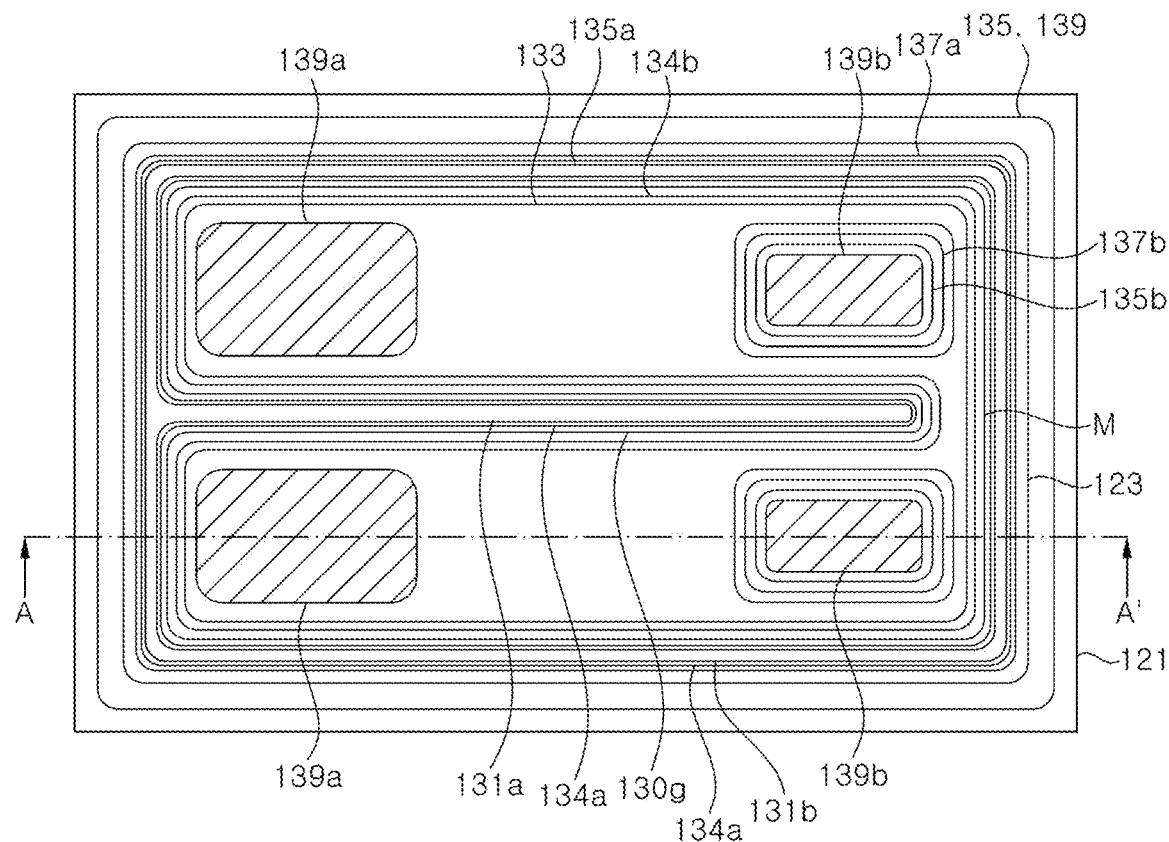
Figure 14B:
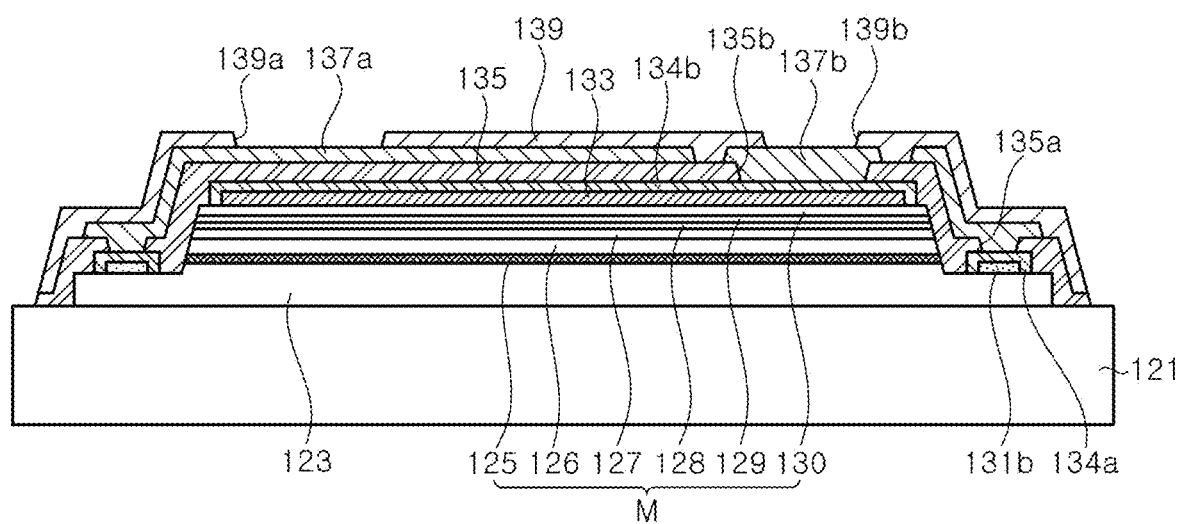

Referring to FIG. 14A and FIG. 14B, an upper insulation layer 139 is formed on the first pad metal layer 137a and the second pad metal layer 137b. The upper insulation layer 139 may cover the first pad metal layer 137a and the second pad metal layer 137b and may also cover an edge of the n-type semiconductor layer 123. The upper insulation layer 139 may also cover a portion of the upper surface of the substrate 121.

The upper insulation layer 139 has openings 139a and 139b exposing the first pad metal layer 137a and the second pad metal layer 137b. The openings 139a expose the first pad metal layer 137a, and the openings 139b expose the second pad metal layer 137b. The openings 139a may be formed near one edge of the mesa M, and the openings 139b may be formed near the opposite edge of the mesa M to be opposite to the openings 139a.

Subsequently, as shown in FIGS. 6A and 6B, a first bump 141a and a second bump 141b are formed on the upper insulation layer 139. The first bump 141a is electrically connected to the first pad metal layer 137a through the openings 139a, and the second bump 141b is electrically connected to the second pad metal layer 137b through the opening 139b.

The first bump 141a and the second bump 141b may partially cover the side surface of the mesa M, respectively, but may be formed to be formed to be within an upper region of the mesa M.

According to the illustrated exemplary embodiment, current is evenly spread over an entire region of the mesa M by forming the groove 130g in the mesa M region and forming the lower n-ohmic contact layers 131a and 131b around the mesa M and in the groove 130g.

While illustrative aspects of the invention have been shown and described in conjunction with a light emitting diode, it is understood that the heterostructure described herein can be used to fabricate any of various other types of optoelectronic devices, such as a laser diode, a photodetector, a photodiode, etc. As used herein, the singular forms "a," "an," and "the" include the plural forms as well, unless the context clearly indicates otherwise. Additionally, the terms "comprises," "includes," "has," and related forms of each, when used in this specification, specify the presence of stated features, but do not preclude the presence or addition of one or more other features and/or groups thereof.

As also used herein, a layer is a transparent layer or is considered to transmit radiation having a target wavelength when the layer allows at least ten percent of the radiation having the target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/−one percent).

It is understood that, unless otherwise specified, each value is approximate and each range of values included herein is inclusive of the end values defining the range. Terms of degree such as "generally," "substantially," "about," and "approximately" as used herein mean a reasonable amount of deviation of the modified term such that the end result is not significantly changed. For example, these terms can be construed as including a deviation of at least +/−0.5% of the modified term if this deviation would not negate the meaning of the word it modifies. In a more particular example, the term "approximately" is inclusive of values within +/−ten percent of the stated value, while the term "substantially" is inclusive of values within +/−five percent of the stated value when these deviations would not negate the meaning of the word each term modifies. Unless otherwise stated, two values/structures are "similar" when the amount of deviation between the two values/structures does not significantly change the result.

Various embodiments of the present disclosure described above may be variously modified and changed without departing from the spirit and scope of the present disclosure, and the present disclosure includes all of the broad scope of the appended claims.

What is claimed is:

1. A light emitting diode, comprising:
a lower n-type semiconductor layer;
an active layer disposed on the lower n-type semiconductor layer;
a p-type semiconductor layer disposed on the active layer;
a high-concentration n-type semiconductor layer disposed on the p-type semiconductor layer; and
an upper n-type semiconductor layer disposed on the high-concentration n-type semiconductor layer, wherein:
the high-concentration n-type semiconductor layer has a higher n-type doping concentration than that of the lower or upper n-type semiconductor layer, and
oxygen concentrations on a lower surface and an upper surface of the high-concentration n-type semiconductor layer are substantially same.

2. The light emitting diode of claim 1, wherein the upper n-type semiconductor layer has a roughened surface on its upper surface.

3. The light emitting diode of claim 1, further comprising:
a high concentration p-type semiconductor layer interposed between the p-type semiconductor layer and the high concentration n-type semiconductor layer,
wherein the high-concentration p-type semiconductor layer has a higher p-type doping concentration than that of the p-type semiconductor layer.

4. The light emitting diode of claim 1, further comprising:
a first contact layer in contact with the lower n-type semiconductor layer; and
a second contact layer in contact with the upper n-type semiconductor layer;
wherein the first and second contact layers include a layer of a same material in contact with the lower and upper n-type semiconductor layers.

5. The light emitting diode of claim 1, further comprising:
an electron blocking layer interposed between the active layer and the p-type semiconductor layer.

6. The light emitting diode of claim 1, comprising:
a mesa disposed on the lower n-type semiconductor layer, including the active layer, the p-type semiconductor layer, the high-concentration n-type semiconductor layer, and the upper n-type semiconductor layer, and having a plurality of via holes exposing the lower n-type semiconductor layer;
lower n-ohmic contact layers in contact with the lower n-type semiconductor layer in the via holes;
an upper n-ohmic contact layer in contact with the upper n-type semiconductor layer;
a first pad metal layer electrically connected to the lower n-ohmic contact layers;
a second pad metal layer electrically connected to the upper n-ohmic contact layer;
a first bump electrically connected to the first pad metal layer; and
a second bump electrically connected to the second pad metal layer,
wherein the second pad metal layer is formed to surround the first pad metal layer.

7. The light emitting diode of claim 6,
wherein the first pad metal layer covers the via holes.
8. The light emitting diode of claim 7,
wherein the second pad metal layer is disposed between the via holes and an edge of the mesa.
9. The light emitting diode of claim 7, further comprising:
a lower insulation layer covering the upper n-ohmic contact layer and the lower n-ohmic contact layers, wherein:
the lower insulation layer has openings exposing the upper n-ohmic contact layer and the lower n-ohmic contact layers, and
the first pad metal layer and the second pad metal layer are electrically connected to the lower n-ohmic contact layers and the upper n-ohmic contact layer through the openings of the lower insulation layer, respectively.
10. The light emitting diode of claim 9, further comprising:
an upper insulation layer covering the first and second pad metal layers, wherein the upper insulation layer has openings exposing the first pad metal layer and the second pad metal layer,
the first bump and the second bump are disposed on the upper insulation layer, and electrically connected to the first pad metal layer and the second pad metal layer through the openings of the upper insulation layer.
11. A light emitting diode, comprising:
a lower n-type semiconductor layer;
a mesa including:
an active layer disposed on the lower n-type semiconductor layer;
an electron blocking layer disposed on the active layer;
a p-type semiconductor layer disposed on the electron blocking layer;
a high-concentration n-type semiconductor layer disposed on the p-type semiconductor layer; and
an upper n-type semiconductor layer disposed on the high-concentration n-type semiconductor layer;
a first pad metal layer electrically connected to a first semiconductor layer;
a second pad metal layer electrically connected to a second semiconductor layer that differs from the first semiconductor layer;
a first bump electrically connected to the first pad metal layer; and
a second bump electrically connected to the second pad metal layer,
wherein the second pad metal layer is formed to surround the first pad metal layer, and
wherein the high-concentration n-type semiconductor layer has a higher n-type doping concentration than that of the lower or upper n-type semiconductor layer.
12. The light emitting diode of claim 11,
wherein the upper n-type semiconductor layer has a roughened surface on its upper surface.
13. The light emitting diode of claim 11, further comprising:
a high concentration p-type semiconductor layer interposed between the p-type semiconductor layer and the high concentration n-type semiconductor layer,
wherein the high-concentration p-type semiconductor layer has a higher p-type doping concentration than that of the p-type semiconductor layer.
14. The light emitting diode of claim 11, further comprising:
a first contact layer in contact with the lower n-type semiconductor layer; and
a second contact layer in contact with the upper n-type semiconductor layer;
wherein the first and second contact layers include a layer of a same material in contact with the lower and upper n-type semiconductor layers.
15. The light emitting diode of claim 11,
wherein the mesa is disposed on the lower n-type semiconductor layer and includes a plurality of via holes exposing the lower n-type semiconductor layer;
the light emitting diode comprising:
lower n-ohmic contact layers in contact with the lower n-type semiconductor layer in the via holes; and
an upper n-ohmic contact layer in contact with the upper n-type semiconductor layer;
wherein the first pad metal layer is electrically connected to the lower n-ohmic contact layers; and
wherein the second pad metal layer is electrically connected to the upper n-ohmic contact layer.
16. The light emitting diode of claim 11,
wherein the mesa includes a via hole exposing the lower n-type semiconductor layer, and
wherein the first pad metal layer covers the via hole.
17. The light emitting diode of claim 11,
wherein the mesa includes a plurality of via holes exposing the lower n-type semiconductor layer, and
wherein the second pad metal layer is disposed between the plurality of via holes and an edge of the mesa.
18. The light emitting diode of claim 11,
wherein the mesa includes a via hole exposing the lower n-type semiconductor layer;
the light emitting diode further comprising:
a lower n-ohmic contact layer in contact with the lower n-type semiconductor layer in the via hole;
an upper n-ohmic contact layer in contact with the upper n-type semiconductor layer; and
a lower insulation layer covering the upper n-ohmic contact layer and the lower n-ohmic contact layer, wherein:
the lower insulation layer has openings exposing the upper n-ohmic contact layer and the lower n-ohmic contact layer, and
the first pad metal layer and the second pad metal layer are electrically connected to the lower n-ohmic contact layer and the upper n-ohmic contact layer through the openings of the lower insulation layer, respectively.
19. The light emitting diode of claim 18, further comprising:
an upper insulation layer covering the first and second pad metal layers, wherein the upper insulation layer has openings exposing the first pad metal layer and the second pad metal layer,
the first bump and the second bump are disposed on the upper insulation layer, and electrically connected to the first pad metal layer and the second pad metal layer through the openings of the upper insulation layer.
20. A light emitting diode, comprising:
a lower n-type semiconductor layer;
an active layer disposed on the lower n-type semiconductor layer;
an electron blocking layer disposed on the active layer;
a p-type semiconductor layer disposed on the electron blocking layer;
a high-concentration n-type semiconductor layer disposed on the p-type semiconductor layer; and
an upper n-type semiconductor layer disposed on the high-concentration n-type semiconductor layer, wherein the high-concentration n-type semiconductor layer has a higher n-type doping concentration than that of the lower or upper n-type semiconductor layer;

wherein the high-concentration n-type semiconductor layer is a gallium nitride-based semiconductor layer having a same composition as that of the p-type semiconductor layer; and wherein oxygen concentrations on a lower surface and an upper surface of the high-concentration n-type semiconductor layer are substantially same.

* * * * *